(12) United States Patent
Sato et al.

(10) Patent No.: US 8,018,004 B2
(45) Date of Patent: Sep. 13, 2011

(54) SEMICONDUCTOR DEVICE AND MANUFACTURING METHOD THEREOF

(75) Inventors: Yoshihiro Sato, Hyogo (JP); Hisashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 106 days.

(21) Appl. No.: 12/028,601

(22) Filed: Feb. 8, 2008

(65) Prior Publication Data

US 2008/0283928 A1    Nov. 20, 2008

(30) Foreign Application Priority Data

May 18, 2007 (JP) .................. 2007-133488

(51) Int. Cl.
*H01L 27/092* (2006.01)
*H01L 21/8238* (2006.01)
(52) U.S. Cl. ......... 257/369; 257/E27.062; 257/E21.632; 438/229
(58) Field of Classification Search .................. 257/369, 257/412
See application file for complete search history.

(56) References Cited

U.S. PATENT DOCUMENTS

| | | | | |
|---|---|---|---|---|
| 5,641,983 A * | 6/1997 | Kato et al. | ..... | 257/412 |
| 6,614,081 B2 * | 9/2003 | Makabe et al. | ..... | 257/410 |
| 7,015,554 B2 * | 3/2006 | Nakaoka et al. | ..... | 257/392 |
| 7,557,414 B2 * | 7/2009 | Suzuki et al. | ..... | 257/369 |
| 7,576,395 B2 | 8/2009 | Jung et al. | | |
| 2005/0280104 A1 * | 12/2005 | Li | ..... | 257/406 |
| 2006/0003507 A1 * | 1/2006 | Jung et al. | ..... | 438/197 |
| 2006/0131676 A1 * | 6/2006 | Saito et al. | ..... | 257/412 |

FOREIGN PATENT DOCUMENTS

CN    1722437 A    1/2006

OTHER PUBLICATIONS

Hobbs, C. et al, "Fermi Level Pinning at the PolySi/Metal Oxide Interface," 2003 Symposium on VLSI Technology Digest of Technical Papers, Jun. 2003.
Samavedam, S. B. et al, "Dual-Metal Gate CMOS with HfO2 Gate Dielectric,"2002 IEEEE, Motorola Digital DNA.
Zhang, Z. B. et al., "Integration of Dual Metal Gate CMOS with TaSiN (NMOS) and Ru (PMOS) Gate Electrodes on HfO2 Gate Dielectric," 2005 Symposium on VLSI Technology Digest of Technical Papers, p. 50-51.
Song, S.C. et al., "Highly Manufacturable 45nm LSTP CMOSFETs Using Novel Dual High-k and Dual Metal Gate CMOS Integration," 2006 Symposium on VLSI Technology Digest of Technical Papers, 2006 IEEEE, Aug. 2006.
Chinese Office Action issued in Chinese Patent Application No. CN 200810003870.9 dated Mar. 10, 2011.

* cited by examiner

*Primary Examiner* — Jarrett Stark
*Assistant Examiner* — Lawrence Tynes, Jr.
(74) *Attorney, Agent, or Firm* — McDermott Will & Emery LLP

(57) ABSTRACT

A semiconductor device comprises a first MIS transistor and a second MIS transistor. The first MIS transistor includes a first gate insulating film formed on a first active region, and a first gate electrode formed on the first gate insulating film. The second MIS transistor includes a second gate insulating film formed on a second active region and made of an insulating material different from that of the first gate insulating film, and a second gate electrode formed on the second gate insulating film. Upper regions of the first gate electrode and the second gate electrode are electrically connected to each other on the isolation region located between the first active region and the second active region, and lower regions thereof are separated from each other with a sidewall insulating film made of the same insulating material as that of the first gate insulating film being interposed therebetween.

18 Claims, 22 Drawing Sheets

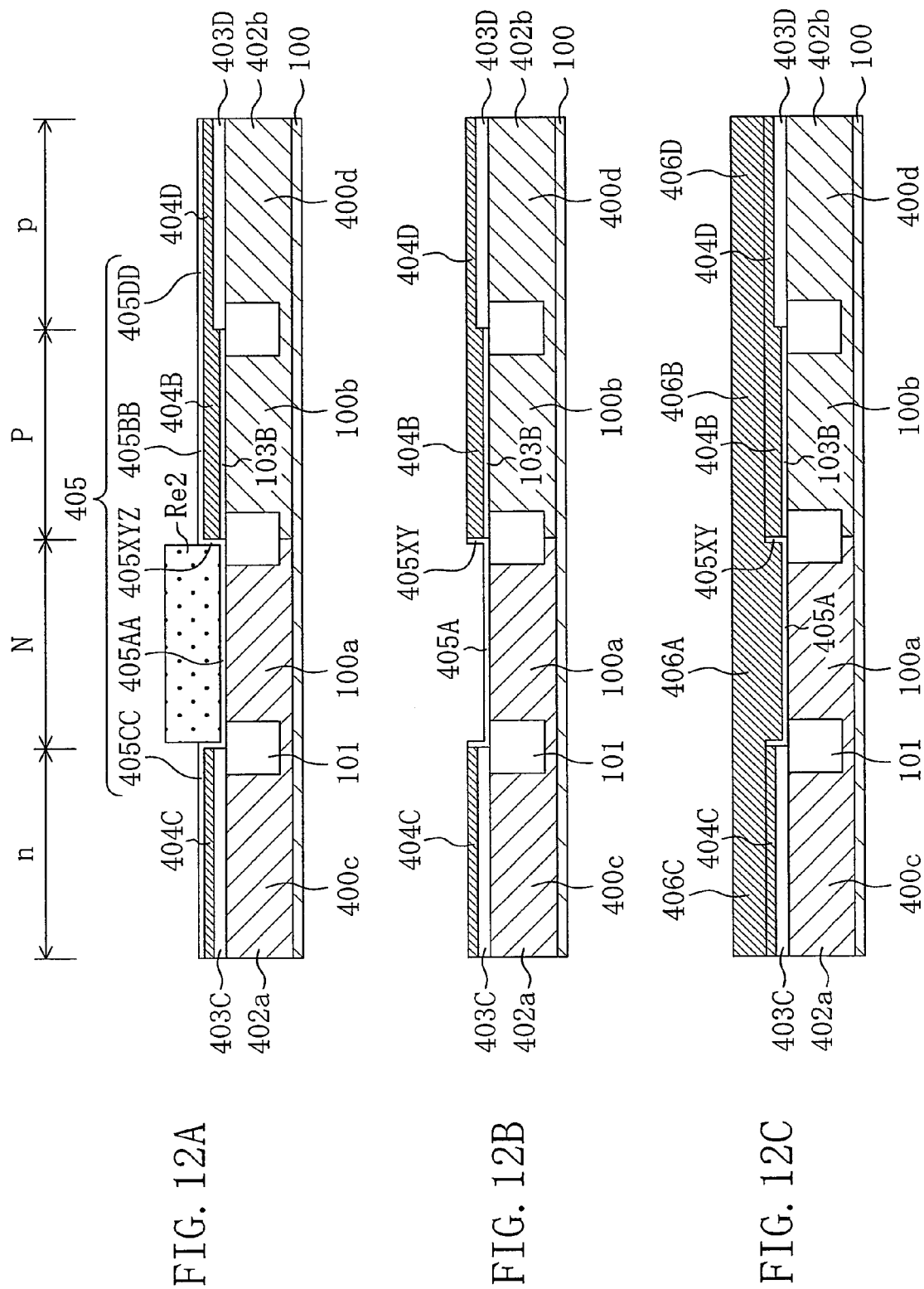

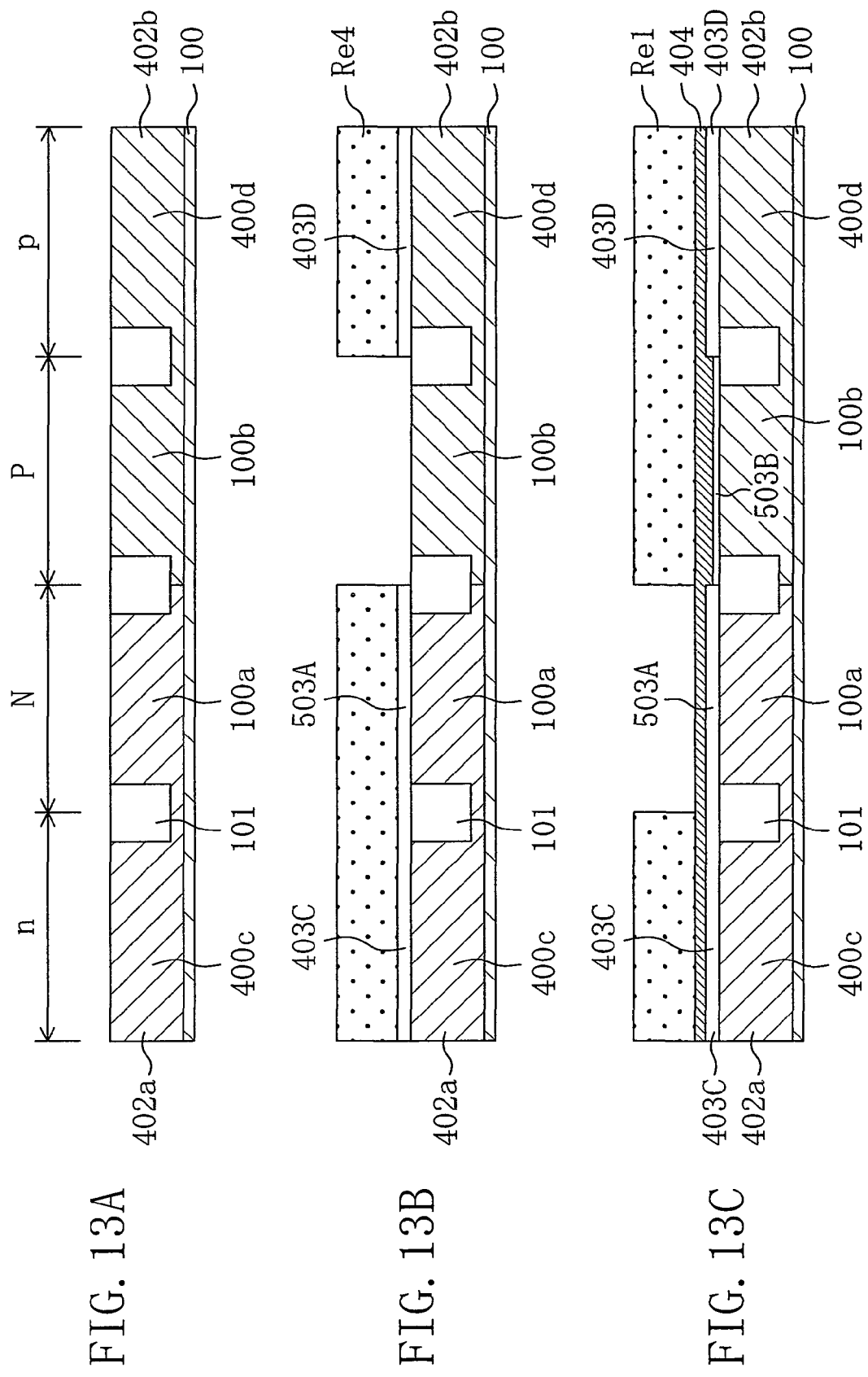

ND MANUFACTURING METHOD THEREOF

SEMICONDUCTOR DEVICE AND MANUFACTURING METHOD THEREOF

CROSS REFERENCE TO RELATED APPLICATIONS

This Non-provisional application claims priority under 35 U.S.C. §119(a) on Patent Application No. 2007-133488 filed in Japan on May 18, 2007, the entire contents of which are hereby incorporated by reference.

BACKGROUND OF THE INVENTION

1. Field of the Invention

The present invention relates to a semiconductor device and a manufacturing method thereof. More particularly, the present invention relates to a semiconductor device having gate insulating films made of insulating materials which differ between an N-type MISFET and a P-type MISFET, and a method for manufacturing the semiconductor device.

2. Description of the Related Art

To further increase the packaging density and processing speed of a semiconductor integrated circuit device, the size of an MISFET is being decreased, and a gate insulating film made of a high-k material, such as, representatively, alumina ($Al_2O_3$), hafnia ($HfO_2$), or hafnium silicate ($HfSiO_x$), is being developed toward commercialization instead of a conventional gate insulating film made of a silicon oxide film (or a silicon oxynitride film). Since such a high-k film has a considerably higher permittivity than that of the silicon oxide film, the physical film thickness can be caused to be thicker, thereby making it possible to avoid a problem that gate leakage current increases with a decrease in film thickness of the gate insulating film made of the silicon oxide film. However, when a polysilicon film is used as a gate electrode which is formed on the gate insulating film of the high-k film, a threshold voltage is shifted due to a phenomenon called Fermi level pinning (see, for example, Non-Patent Document 1: C. Hobbs et al., "Fermi Level Pinning at the PolySi/Metal Oxide Interface", VLSI Tech. Digest 2003), so that device performance is deteriorated, particularly in P-type MISFETs. Therefore, the high-k film can be used as a gate insulating film which is used in N-type MISFETs (hereinafter referred to as N-type MIS transistors), but not as a gate insulating film which is used in P-type MISFETs (hereinafter referred to as P-type MIS transistors) (i.e., gate insulating films made of different insulating materials need to be separately formed in the N-type MIS transistor and the P-type MIS transistor).

An MISFET which has a metal gate electrode made of a metal film has attracted attention as a solution to problems that the depletion-layer capacitance of a polysilicon gate electrode becomes significant and boron penetrates into the channel region due to a very thin thickness of the gate insulating film.

When a polysilicon film is used as a gate electrode, an n-type impurity is implanted into a polysilicon gate electrode included in the N-type MIS transistor, and a p-type impurity is implanted into a polysilicon gate electrode included in the P-type MIS transistor, thereby providing a dual-gate structure. In contrast, when a metal film is used as a gate electrode, separate metal gate electrodes are formed in the N-type MIS transistor and the P-type MIS transistor, thereby providing a dual-metal gate structure.

By thus employing metal gate electrodes made of metal materials differing between the N-type MIS transistor and the P-type MIS transistor, the work function of the metal gate electrode is controlled, depending on the conductivity type of the MIS transistor (see, for example, Non-Patent Document 2: S. B. Samavedam et al., "Dual-Metal Gate CMOS with $HfO_2$ Gate Dielectric", IEDM Tech. Digest 2002 and Non-Patent Document 3: Z. B. Zhang et al., "Integration of Dual Metal Gate CMOS with TaSiN (NMOS) and Ru (PMOS) Gate Electrodes on $HfO_2$ Gate Dielectric", VLSI Tech. Digest 2005). Also, the work function of the metal gate electrode material strongly depends on the gate insulating film material. Therefore, in order to improve the performance of the MIS transistor, the individual gate insulating films can be individually optimized for the N-type MIS transistor and the P-type MIS transistor (see, for example, Non-Patent Document 4: S. C. Song et al., "Highly Manufacturable 45 nm LSTP CMOSFETs Using Novel Dual High-k and Dual Metal Gate CMOS Integration", VLSI Tech. Digest 2006).

However, when gate insulating films made of insulating materials differing between the N-type MIS transistor and the P-type MIS transistor are formed separately, the following problem arises.

Here, the following method is contemplated as a method for forming gate insulating films separately for the N-type MIS transistor and the P-type MIS transistor.

A gate insulating film forming film for the N-type MIS transistor (hereinafter simply referred to as "for nMIS") is formed on an entire surface of a semiconductor substrate. Thereafter, a resist is formed on the gate insulating film forming film for nMIS, covering an N-type MIS forming region while leaving a P-type MIS forming region exposed. Thereafter, etching is performed using the resist as a mask to remove a portion of the gate insulating film forming film for nMIS which is exposed through the opening of the resist, followed by ashing to remove the resist. Thus, the gate insulating film forming film for nMIS is formed on the N-type MIS forming region in a semiconductor substrate (the gate insulating film forming film for nMIS will become a gate insulating film for nMIS by patterning in a subsequent step, though not described).

Next, a gate insulating film forming film for the P-type MIS transistor (hereinafter simply referred to as "for pMIS") is formed on an entire surface of the semiconductor substrate. Thereafter, a resist is formed on the gate insulating film forming film for pMIS, covering the P-type MIS forming region while leaving the N-type MIS forming region exposed. Thereafter, etching is performed using the resist as a mask to remove a portion of the gate insulating film forming film for pMIS which is exposed through the opening of the resist, followed by ashing to remove the resist. Thus, the gate insulating film forming film for pMIS is formed on the P-type MIS forming region in the semiconductor substrate (the gate insulating film forming film for pMIS will become a gate insulating film for pMIS by patterning in a subsequent step, though not described).

Note that, in the method above, when the portion of the gate insulating film forming film for pMIS which is exposed through the opening of the resist (in other words, a portion of the gate insulating film forming film for pMIS which is formed on the gate insulating film forming film for nMIS) is removed by etching, it is considerably difficult to selectively remove only the gate insulating film forming film for pMIS without removing the gate insulating film forming film for nMIS below the gate insulating film forming film for pMIS. Therefore, the gate insulating film for nMIS cannot be formed with high accuracy, likely leading to a deterioration in device characteristics of the N-type MIS transistor.

Note that, in the method above, it has been assumed as a specific example that the gate insulating film forming film for pMIS is formed after formation of the gate insulating film forming film for nMIS. Conversely, when the gate insulating film forming film for nMIS is formed after formation of the gate insulating film forming film for pMIS, the gate insulating film for pMIS cannot be formed with high accuracy, likely leading to a deterioration in device characteristics of the P-type MIS transistor.

Also in the method above, when the resist on the gate insulating film forming film for nMIS is removed by ashing, the gate insulating film forming film for nMIS below the resist is damaged, likely leading to an increase in interface level of the gate insulating film for nMIS, and therefore, a deterioration in device characteristics of the N-type MIS transistor. In addition, when the resist on the gate insulating film forming film for pMIS is removed, the gate insulating film forming film for pMIS below the resist is damaged, likely leading to a deterioration in device characteristics of the P-type MIS transistor. Thus, the gate insulating films for nMIS and pMIS cannot be formed with high accuracy, likely leading to a deterioration in device characteristics of the N- and P-type MIS transistors.

SUMMARY OF THE INVENTION

In view of the above-described problems, an object of the present invention is to provide a semiconductor device comprising a first MIS transistor and a second MIS transistor, in which gate insulating films made of insulating materials which differs between the first MIS transistor and the second MIS transistor are formed with high accuracy.

To achieve the object, a semiconductor device according to an aspect of the present invention comprises a first MIS transistor and a second MIS transistor. The first MIS transistor includes a first active region surrounded by an isolation region in a semiconductor substrate, a first gate insulating film formed on the first active region, and a first gate electrode formed on the first gate insulating film. The second MIS transistor includes a second active region surrounded by the isolation region in the semiconductor substrate, a second gate insulating film formed on the second active region and made of an insulating material different from that of the first gate insulating film, and a second gate electrode formed on the second gate insulating film. Upper regions of the first gate electrode and the second gate electrode are electrically connected to each other on the isolation region located between the first active region and the second active region, and lower regions thereof are separated from each other with a sidewall insulating film made of the same insulating material as that of the first gate insulating film being interposed therebetween.

According to the semiconductor device of the aspect of the present invention, the first and second gate insulating films made of insulating materials differing between the first MIS transistor and the second MIS transistor can be obtained with high accuracy, thereby making it possible to provide first and second MIS transistors having desired device characteristics.

In the semiconductor device of the aspect of the present invention, the second gate electrode preferably includes a first electrode formed on the second gate insulating film and a second electrode formed on the first electrode, and the sidewall insulating film is preferably formed on a side surface of the first electrode.

In the semiconductor device of the aspect of the present invention, the first electrode is preferably made of a first silicon film, the second electrode is preferably made of a second silicon film, the first gate electrode is preferably made of the second silicon film formed on the first gate insulating film, and the second electrode and the first gate electrode are preferably integrally formed.

In the semiconductor device of the aspect of the present invention, the first gate electrode preferably includes a third electrode formed on the first gate insulating film and a fourth electrode formed on the third electrode, and the sidewall insulating film is preferably provided between the first electrode and the third electrode.

In the semiconductor device of the aspect of the present invention, the first electrode is preferably made of a first silicon film, the second electrode is preferably made of a second silicon film, the third electrode is preferably made of a third silicon film, the fourth electrode is preferably made of the second silicon film, and the second electrode and the fourth electrode are preferably integrally formed.

In the semiconductor device of the aspect of the present invention, the first electrode is preferably made of a first metal film, the second electrode is preferably made of a silicon film, the third electrode is made of a preferably second metal film, the fourth electrode is preferably made of the silicon film, and the second electrode and the fourth electrode are preferably integrally formed.

Thus, even in the semiconductor device having the metal gate electrode, the first and second gate insulating films made of insulating material differing between the first MIS transistor and the second MIS transistor can be obtained with high accuracy.

In the semiconductor device of the aspect of the present invention, the first metal film and the second metal film are preferably made of metal materials having different compositions or composition ratios.

In the semiconductor device of the aspect of the present invention, the first gate electrode is preferably made of a second silicon film, the second gate electrode is preferably made of a first silicon film, and the first gate electrode and the second gate electrode are preferably electrically connected to each other since a first silicide layer formed on the second silicon film and a second silicide layer formed on the first silicon film are electrically connected to each other on the sidewall insulating film.

The semiconductor device of the aspect of the present invention preferably further comprises a first silicide layer formed on the first gate electrode, and a second silicide layer formed on the second gate electrode.

In the semiconductor device of the aspect of the present invention, the first gate electrode is preferably made of a fully-silicided first silicide film, and the second gate electrode is preferably made of a fully-silicided second silicide film.

Thus, even in the semiconductor device having the fully-silicided gate electrode, the first and second gate insulating films made of insulating material differing between the first MIS transistor and the second MIS transistor can be obtained with high accuracy.

In the semiconductor device of the aspect of the present invention, the first silicide film is preferably made of NiSi film, and the second silicide film is preferably made of $Ni_2Si$ film.

In the semiconductor device of the aspect of the present invention, the first gate insulating film is preferably made of a high-k film, and the second gate insulating film is preferably made of a silicon oxide film or a silicon oxynitride film.

In the semiconductor device of the aspect of the present invention, the high-k film is preferably made of a metal oxide film.

In the semiconductor device of the aspect of the present invention, the high-k film preferably contains at least one of oxides of hafnium, tantalum, zirconium, titanium, aluminum, scandium, yttrium, and lanthanum.

In the semiconductor device of the aspect of the present invention, the first gate insulating film is preferably made of a first high-k film, the second gate insulating film is preferably made of a second high-k film, and the first high-k film and the second high-k film are preferably made of insulating materials having different compositions or composition ratios.

The semiconductor device of the aspect of the present invention preferably further comprises a third MIS transistor having a third active region surrounded by the isolation region in the semiconductor substrate, a third gate insulating film formed on the third active region, and a third gate electrode formed on the third gate insulating film. The third gate insulating film preferably has a film thickness larger than that of the second gate insulating film and is made of the same insulating material as that of the second gate insulating film.

Thus, even in the semiconductor device comprising an I/O (Input/Output) transistor (i.e., the third MIS transistor having the third gate insulating film having a relatively large film thickness), the first and second gate insulating films made of insulating material differing between the first MIS transistor and the second MIS transistor can be obtained with high accuracy.

The semiconductor device of the aspect of the present invention preferably further comprises a first sidewall formed on a side surface of the first gate electrode, a first source/drain region formed outside the first sidewall in the first active region, a second sidewall formed on a side surface of the second gate electrode, and a second source/drain region formed outside the second sidewall in the second active region.

The semiconductor device of the aspect of the present invention preferably further comprises a third silicide layer formed on the first source/drain region, and a fourth silicide layer formed on the second source/drain region.

In the semiconductor device of the aspect of the present invention, the sidewall insulating film is preferably formed integrally with the first gate insulating film.

In the semiconductor device of the aspect of the present invention, the sidewall insulating film is preferably formed and separated from the first gate insulating film.

In the semiconductor device of the aspect of the present invention, the first MIS transistor is preferably an N-type MIS transistor, and the second MIS transistor is preferably a P-type MIS transistor.

To achieve the object, a method for manufacturing a semiconductor device according to another aspect of the present invention is provided. The semiconductor device comprises a first MIS transistor having a first gate insulating film and a first gate electrode and a second MIS transistor having a second gate insulating film and a second gate electrode. The method comprises the steps of (a) forming a first active region and a second active region surrounded by an isolation region in a semiconductor substrate, and (b) forming the first gate insulating film and the first gate electrode on the first active region, and the second gate insulating film and the second gate electrode on the second active region. The second gate insulating film is made of an insulating material different from that of the first gate insulating film. In the step (b), upper regions of the first gate electrode and the second gate electrode are electrically connected to each other on the isolation region located between the first active region and the second active region, and lower regions thereof are formed with a sidewall insulating film made of the same insulating material as that of the first gate insulating film being interposed therebetween.

According to the semiconductor device manufacturing method of the aspect of the present invention, the first and second gate insulating films made of insulating materials differing between the first MIS transistor and the second MIS transistor can be obtained with high accuracy, thereby making it possible to provide first and second MIS transistors having desired device characteristics.

In the semiconductor device manufacturing method of the aspect of the present invention, the step (b) preferably includes (b1) forming a second gate insulating film forming film and a first electrode forming film on the second active region, (b2) forming a first gate insulating film forming film on the semiconductor substrate after the step (b1), (b3) removing the first gate insulating film forming film on the first electrode forming film while leaving the first gate insulating film forming film on the first active region, (b4) forming a second electrode forming film on the semiconductor substrate after the step (b3), and (b5) subjecting the second electrode forming film and the first gate insulating film forming film on the first active region to patterning, thereby forming the first gate insulating film made of the first gate insulating film forming film and the first gate electrode made of the second electrode forming film, and subjecting the second electrode forming film, the first electrode forming film, and the second gate insulating film forming film on the second active region to patterning, thereby forming the second gate insulating film made of the second gate insulating film forming film, and the second gate electrode made of the first electrode forming film and the second electrode forming film.

Thus, the first gate insulating film forming film on the first electrode forming film can be removed in a state in which the first gate insulating film forming film is formed via the first electrode forming film on the second gate insulating film forming film. Therefore, only the first gate insulating film forming film on the first electrode forming film can be selectively removed (i.e., without etching damage on the second gate insulating film forming film), leaving the first gate insulating film forming film on the first active region.

Therefore, the first and second gate insulating films made of insulating materials differing between the first MIS transistor and the second MIS transistor can be formed with high accuracy.

In the semiconductor device manufacturing method of the aspect of the present invention, the step (b) preferably includes (b1) forming a second gate insulating film forming film and a first electrode forming film on the second active region, (b2) forming a first gate insulating film forming film and a second electrode forming film on the semiconductor substrate after the step (b1), (b3) removing the first gate insulating film forming film and the second electrode forming film on the first electrode forming film while leaving the first gate insulating film forming film and the second electrode forming film on the first active region, (b4) forming a third electrode forming film on the semiconductor substrate after the step (b3), and (b5) subjecting the third electrode forming film, the second electrode forming film, and the first gate insulating film forming film on the first active region to patterning, thereby forming the first gate insulating film made of the first gate insulating film forming film and the first gate electrode made of the second electrode forming film and the third electrode forming film, and subjecting the third electrode forming film, the first electrode forming film, and the second gate insulating film forming film on the second active region to patterning, thereby forming the second gate insulating film made of the second gate insulating film forming film, and the second gate electrode made of the first electrode forming film and the third electrode forming film.

Thus, the first gate insulating film forming film on the first electrode forming film can be removed in a state in which the first gate insulating film forming film is formed via the first electrode forming film on the second gate insulating film forming film. Therefore, only the first gate insulating film forming film on the first electrode forming film can be selectively removed, leaving the first gate insulating film forming film on the first active region.

In addition, thus, the first gate insulating film forming film on the first electrode forming film can be removed in a state in which the first second electrode forming film is formed on the gate insulating film forming film (i.e., the first gate insulating film forming film on the first electrode forming film can be removed without the necessity of a resist which is formed on the first gate insulating film forming film). Therefore, the first gate insulating film forming film is not likely to be damaged by removal of a resist.

Therefore, the first and second gate insulating films made of insulating materials differing between the first MIS transistor and the second MIS transistor can be formed with higher accuracy.

In the semiconductor device manufacturing method of the aspect of the present invention, the step (b) preferably includes (b1) forming a second gate insulating film forming film and a first electrode forming film on the second active region, (b2) forming a first gate insulating film forming film and a second electrode forming film on the semiconductor substrate after the step (b1), (b3) removing the first gate insulating film forming film and the second electrode forming film on the first electrode forming film while leaving the first gate insulating film forming film and the second electrode forming film on the first active region, and (b4) subjecting the second electrode forming film and the first gate insulating film forming film on the first active region to patterning, thereby forming the first gate insulating film made of the first gate insulating film forming film and the first gate electrode made of the second electrode forming film, and subjecting the first electrode forming film and the second gate insulating film forming film on the second active region to patterning, thereby forming the second gate insulating film made of the second gate insulating film forming film and the second gate electrode made of the first electrode forming film.

Thus, the first gate insulating film forming film on the first electrode forming film can be removed in a state in which the first gate insulating film forming film is formed via the first electrode forming film on the second gate insulating film forming film. Therefore, only the first gate insulating film forming film on the first electrode forming film can be removed, leaving the first gate insulating film forming film on the first active region.

In addition, thus, the first gate insulating film forming film on the first electrode forming film can be removed in a state in which the second electrode forming film is formed on the first gate insulating film forming film. Therefore, the first gate insulating film forming film is not likely to be damaged by removal of a resist.

Therefore, the first and second gate insulating films made of insulating materials differing between the first MIS transistor and the second MIS transistor can be formed with higher accuracy.

In the semiconductor device manufacturing method of the aspect of the present invention, the semiconductor device preferably further comprises a third MIS transistor having a third gate insulating film and a third gate electrode. The step (a) preferably includes forming a third active region surrounded by the isolation region in the semiconductor substrate. The step (b) preferably includes forming the third gate insulating film and the third gate electrode on the third active region. The third gate insulating film preferably has a film thickness larger than that of the second gate insulating film and is made of the same insulating material as that of the second gate insulating film.

In the semiconductor device manufacturing method of the aspect of the present invention, the step (b) preferably includes (b1) forming a third gate insulating film forming film on a third active region, (b2) forming a second gate insulating film forming film on the second active region after the step (b1), (b3) forming a first electrode forming film on the second gate insulating film forming film and the third gate insulating film forming film, (b4) forming a first gate insulating film forming film on the semiconductor substrate after the step (b3), (b5) removing the first gate insulating film forming film on the first electrode forming film while leaving the first gate insulating film forming film on the first active region, (b6) forming a second electrode forming film on the semiconductor substrate after the step (b5), and (b7) subjecting the second electrode forming film and the first gate insulating film forming film on the first active region to patterning, thereby forming the first gate insulating film made of the first gate insulating film forming film and the first gate electrode made of the second electrode forming film, and subjecting the second electrode forming film, the first electrode forming film, and the second gate insulating film forming film on the second active region to patterning, thereby forming the second gate insulating film made of the second gate insulating film forming film and the second gate electrode made of the first electrode forming film and second electrode forming film, and subjecting the second electrode forming film, the first electrode forming film, and the third gate insulating film forming film on the third active region to patterning, thereby forming the third gate insulating film made of the third gate insulating film forming film and the third gate electrode made of the first electrode forming film and second electrode the forming film.

Thus, even in the semiconductor device comprising an I/O (Input/Output) transistor (i.e., the third MIS transistor having the third gate insulating film having a relatively large film thickness), the first and second gate insulating films made of insulating material differing between the first MIS transistor and the second MIS transistor can be obtained with high accuracy.

The semiconductor device manufacturing method of the aspect of the present invention preferably further comprises the steps of (c) forming a first sidewall on a side surface of the first gate electrode and a second sidewall on a side surface of the second gate electrode, (d) forming a first source/drain region outside the first sidewall in the first active region after the step (c), and (e) forming a second source/drain region outside the second sidewall in the second active region after the step (c).

In the semiconductor device manufacturing method of the aspect of the present invention, the step (b) preferably includes (b1) forming a second gate insulating film forming film and a first silicon film on the second active region, (b2) forming a first gate insulating film forming film on the semiconductor substrate after the step (b1), (b3) removing the first gate insulating film forming film on the first silicon film while leaving the first gate insulating film forming film on the first active region, (b4) forming a second silicon film on the semiconductor substrate after the step (b3), and (b5) subjecting the second silicon film and the first gate insulating film forming film on the first active region to patterning, thereby forming the first gate insulating film made of the first gate insulating film forming film, and a first silicon gate electrode made of the second silicon film, and subjecting the second silicon film, the first silicon film, and the second gate insulating film forming film on the second active region to patterning, thereby forming the second gate insulating film made of the second gate insulating film forming film, and a second silicon gate electrode made of the first silicon film and the second silicon film, and (b6) subjecting the first silicon gate electrode to full silicidation, thereby forming the first gate electrode, and subjecting the second silicon gate electrode to full silicidation, thereby forming the second gate electrode, after the step (b5).

Thus, even in the semiconductor device having the fully-silicided gate electrode, the first and second gate insulating films made of insulating material differing between the first MIS transistor and the second MIS transistor can be obtained with high accuracy.

In the semiconductor device manufacturing method of the aspect of the present invention, the first gate insulating film is preferably made of a high-k film, and the second gate insulating film is preferably made of a silicon oxide film or a silicon oxynitride film.

As described above, according to the semiconductor device of the aspect of the present invention and the manufacturing method thereof, in a semiconductor device comprising a first MIS transistor (N-type MIS transistor) and a second MIS transistor (P-type MIS transistor), gate insulating films made of insulating materials differing between the first MIS transistor and the second MIS transistor can be obtained with high accuracy, thereby making it possible to provide first and second MIS transistors having desired device characteristics.

BRIEF DESCRIPTION OF THE DRAWINGS

FIGS. 12A to 12C are cross-sectional views showing major steps of the semiconductor device manufacturing method of the fourth embodiment of the present invention in the order in which the device is manufactured, as the device is viewed in a gate width direction.

FIGS. 13A to 13C are cross-sectional views showing major steps of a method for manufacturing a semiconductor device according to a fifth embodiment of the present invention in the order in which the device is manufactured, as the device is viewed in a gate width direction.

DETAILED DESCRIPTION OF THE PREFERRED EMBODIMENTS

Hereinafter, embodiments of the present invention will be described with reference to the accompanying drawings.

First Embodiment

Figure 1:
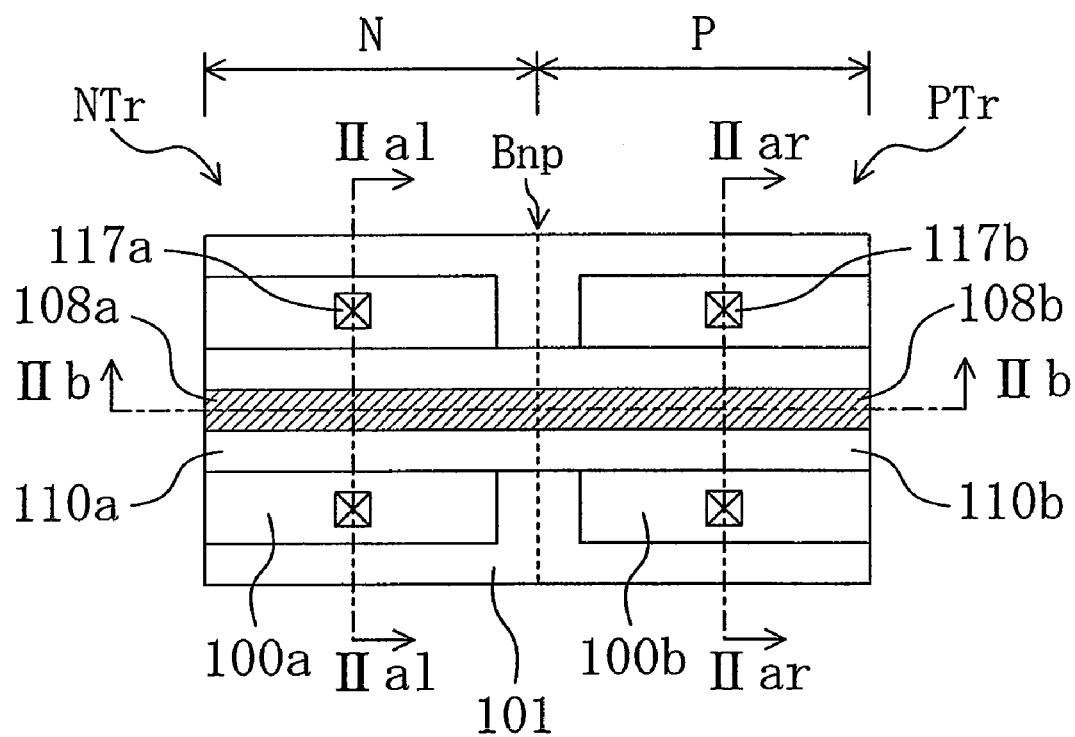
FIG. 1 is a plan view showing a structure of the semiconductor device according to a first embodiment of the present invention.
Figure 2A:
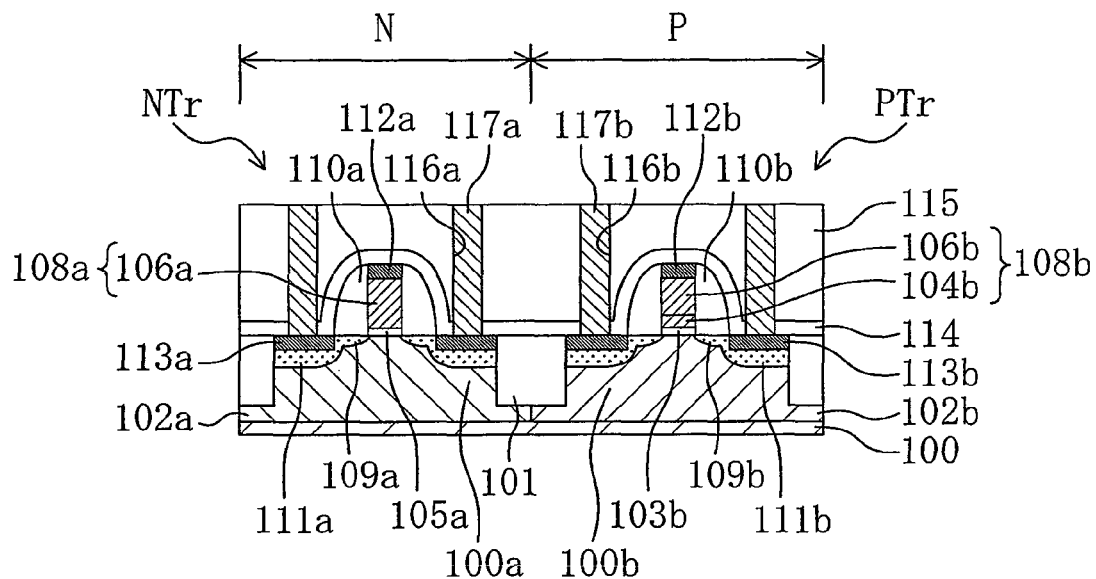
FIGS. 2A and 2B are cross-sectional views showing the structure of the semiconductor device of the first embodiment of the present invention.
Figure 2B:
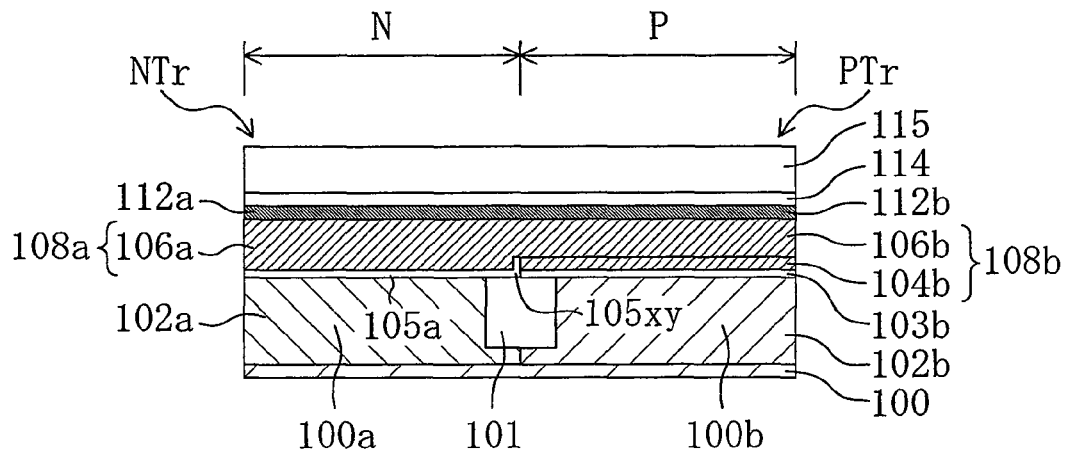

Hereinafter, a semiconductor device according to a first embodiment of the present invention will be described with reference to FIGS. 1, 2A and 2B. FIG. 1 is a plan view showing a structure of the semiconductor device of the first embodiment of the present invention. Note that, in these figures, "N" shown on the left side indicates an N-type MIS forming region and "P" shown on the right side indicates a P-type MIS forming region. Also, in the figures, "Bnp" shown at a border between the N-type MIS forming region N and the P-type MIS forming region P indicates a well border. FIGS. 2A and 2B are cross-sectional views showing the structure of the semiconductor device of the first embodiment of the present invention. Specifically, FIG. 2A is a cross-sectional view in a gate length direction. More specifically, the left side of the figure is a cross-sectional view taken along line IIal-IIal of FIG. 1, and the right side of the figure is a cross-sectional view taken along line IIar-IIar of FIG. 1. Note that, in FIG. 2A, the N-type MIS forming region N and the P-type MIS forming region P are illustrated as being arranged side by side for the sake of simplicity. On the other hand, FIG. 2B is a cross-sectional view in a gate width direction, more specifically, a cross-sectional view taken along line IIb-IIb of FIG. 1.

As shown in FIG. 1, a first active region 100a made of a semiconductor substrate surrounded by an isolation region 101 is formed in the N-type MIS forming region, while a second active region 100b made of the semiconductor substrate surrounded by the isolation region 101 is formed in the P-type MIS forming region. A first gate electrode 108a having a first sidewall 110a on a side surface thereof is formed on the first active region 100a, while a second sidewall 110b having a second gate electrode 108b on a side surface thereof is formed on the second active region 100b. First and second source/drain regions (not shown) are formed outside the first and second sidewalls 110a and 110b in the first and second active regions 100a and 100b, respectively. First and second contact plugs 117a and 117b are electrically connected to the first and second source/drain regions via third and fourth silicide layers (not shown) which are formed on the first and second source/drain regions, respectively.

As shown in FIG. 2A, the isolation region 101, in which an insulating film is buried in a trench, is formed in an upper portion of the semiconductor substrate 100 to separate the N-type MIS forming region and the P-type MIS forming region. An N-type MIS transistor NTr is provided in the N-type MIS forming region, while a P-type MIS transistor PTr is provided in the P-type MIS forming region.

Here, as shown in FIG. 2A, the N-type MIS transistor NTr comprises a p-type well region 102a formed in the N-type MIS forming region of the semiconductor substrate 100, the first active region 100a surrounded by the isolation region 101 in the semiconductor substrate 100, a first gate insulating film 105a formed on the first active region 100a, the first gate electrode 108a including a second electrode 106a formed on the first gate insulating film 105a, the first sidewall 110a formed on the side surface of the first gate electrode 108a, a first extension region 109a formed outside the first gate electrode 108a in the first active region 100a, a first source/drain region 111a formed outside the first sidewall 110a in the first active region 100a, a first silicide layer 112a formed in an upper portion of the first gate electrode 108a, and a third silicide layer 113a formed in an upper portion of the first source/drain region 111a.

On the other hand, as shown in FIG. 2A, the P-type MIS transistor PTr comprises a n-type well region 102b formed in the P-type MIS forming region of the semiconductor substrate 100, the second active region 100b surrounded by the isolation region 101 in the semiconductor substrate 100, a second gate insulating film 103b formed on the second active region 100b, the second gate electrode 108b including a first electrode 104b and a second electrode 106b formed on the second gate insulating film 103b, the second sidewall 110b formed on the side surface of the second gate electrode 108b, a second extension region 109b formed outside the second gate electrode 108b in the second active region 100b, a second source/drain region 111b formed outside the second sidewall 110b of the second active region 100b, a second silicide layer 112b formed in an upper portion of the second gate electrode 108b, and a fourth silicide layer 113b formed in an upper portion of the second source/drain region 111b.

An underlying insulating film 114 is formed on the semiconductor substrate 100, covering the first and second gate electrodes 108a and 108b and the first and second sidewalls 110a and 110b. An interlayer insulating film 115 is formed on the underlying insulating film 114. In the underlying insulating film 114 and the interlayer insulating film 115, the first and second contact plugs 117a and 117b are formed, which are electrically connected via the third and fourth silicide layers 113a and 113b to the first and second source/drain regions 111a and 111b, respectively.

As shown in FIG. 2B, the isolation region 101, in which an insulating film is buried in a trench, is formed in an upper portion of the semiconductor substrate 100 to separate the N-type MIS forming region and the P-type MIS forming region. The p-type well region 102a is formed in the N-type MIS forming region of the semiconductor substrate 100, while the n-type well region 102b is formed in the P-type MIS forming region of the semiconductor substrate 100. The first active region 100a surrounded by the isolation region 101 in the semiconductor substrate 100 is formed in the N-type MIS forming region, while the second active region 100b surrounded by the isolation region 101 in the semiconductor substrate 100 is formed in the P-type MIS forming region.

The first gate electrode 108a having the first silicide layer 112a in the upper portion thereof and including the second electrode 106a is formed via the first gate insulating film 105a on the first active region 100a. On the other hand, the second gate electrode 108b having the second silicide layer 112b in the upper portion thereof and including the first electrode 104b and the second electrode 106b are formed via the second gate insulating film 103b on the second active region 100b.

The underlying insulating film 114 is formed on the semiconductor substrate 100, covering the first and second gate electrodes 108a and 108b. The interlayer insulating film 115 is formed on the underlying insulating film 114.

In the semiconductor device of this embodiment, as shown in FIG. 2B, a sidewall insulating film 105xy having an L-shaped cross-section and made of the same insulating material as that of the first gate insulating film 105a is formed, extending from an upper surface of the isolation region 101 in the N-type MIS forming region across a side surface of the first electrode 104b. The second electrode 106b and the first gate electrode 108a (the second electrode 106a) are integrally formed. Thus, upper regions of the first gate electrode 108a and the second gate electrode 108b are electrically connected to each other, while lower regions thereof are separated from each other with the sidewall insulating film 105xy being interposed therebetween, on the isolation region 101.

Hereinafter, a method for manufacturing the semiconductor device of the first embodiment of the present invention will be described with reference to FIGS. 3A to 3C, 4A to 4C, 5A to 5C, and 6A and 6B. FIGS. 3A to 3C, 4A to 4C, 5A to 5C, and 6A and 6B are cross-sectional views showing major steps of the manufacturing method of the semiconductor device of the first embodiment of the present invention in the order in which the device is manufactured. Note that FIGS. 3A to 3C and 4A to 4C are cross-sectional views showing the major steps as the device is viewed in a gate width direction, where the N-type MIS forming region N is shown on the left side while the P-type MIS forming region P is shown on the right side. On the other hand, FIGS. 5A to 5C and 6A and 6B are cross-sectional views showing the major steps as the device is viewed in a gate length direction, where the N-type MIS forming region N on the left side and the P-type MIS forming region P on the right side are illustrated as being arranged side by side for the sake of simplicity.

Figure 3A:
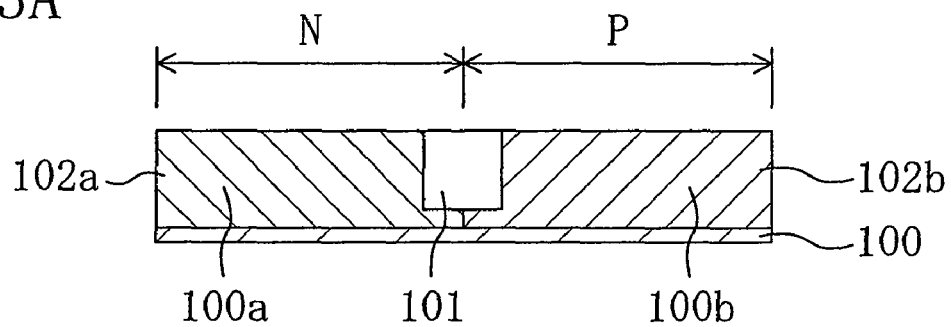
FIGS. 3A to 3C are cross-sectional views showing major steps of a method for manufacturing the semiconductor device of the first embodiment of the present invention in the order in which the device is manufactured, as the device is viewed in a gate width direction.

Firstly, as shown in FIG. 3A, the isolation region 101, in which an insulating film is buried in a trench, is selectively formed in an upper portion of the semiconductor substrate 100 made of, for example, p-type silicon by, for example, Shallow Trench Isolation (STI). Thereby, the first active region 100a made of the semiconductor substrate 100 surrounded by the isolation region 101 is formed in the N-type MIS forming region, while the second active region 100b made of the semiconductor substrate 100 surrounded by the isolation region 101 is formed in the P-type MIS forming region. Thereafter, a p-type impurity, such as B (boron) or the like, is implanted into the N-type MIS forming region of the semiconductor substrate 100 by lithography and ion implantation, and an n-type impurity, such as P (phosphor) or the like, is implanted into the P-type MIS forming region of the semiconductor substrate 100. Thereafter, by a thermal treatment (e.g., 850° C., 30 sec), the p-type well region 102a is formed in the N-type MIS forming region of the semiconductor substrate 100, while the n-type well region 102b is formed in the P-type MIS forming region of the semiconductor substrate 100.

Figure 3B:
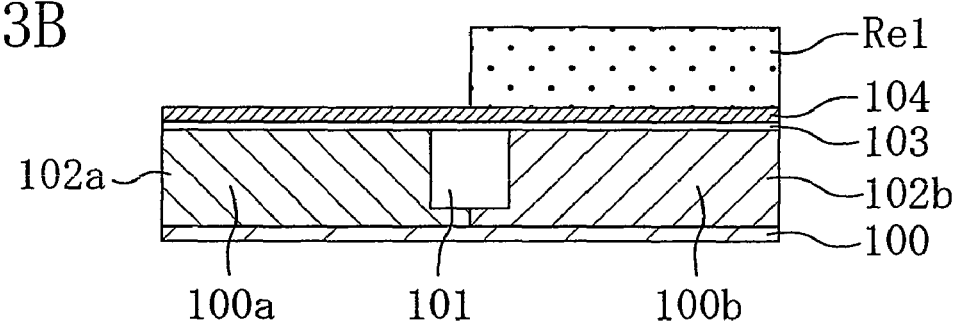

Next, as shown in FIG. 3B, after a surface of the semiconductor substrate 100 is cleaned by a treatment with diluted hydrofluoric acid, a second gate insulating film forming film 103 made of, for example, a silicon oxide film having a film thickness of 2 nm is formed on the first active region 100a and the second active region 100b by, for example, ISSG (In-Situ Steam Generation). Thereafter, a first electrode forming film 104 made of, for example, a polysilicon film having a film thickness of 20 nm is deposited on the second gate insulating film forming film 103 by, for example, CVD (Chemical Vapor Deposition), and thereafter, a resist Re1 is formed on the semiconductor substrate 100 by photolithography, covering the P-type MIS forming region while leaving the N-type MIS forming region exposed.

Figure 3C:
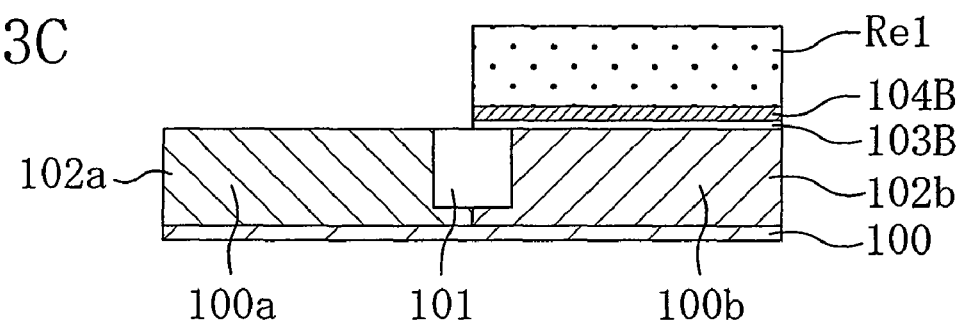

Next, as shown in FIG. 3C, portions formed in the N-type MIS forming region of the first electrode forming film 104 and the second gate insulating film forming film 103 are successively removed by dry etching using the resist Re1 as a mask.

Thus, as shown in FIG. 3C, a first electrode forming film 104B made of the polysilicon film having a film thickness of 20 nm is formed via a second gate insulating film forming film 103B made of the silicon oxide film having a film thickness of 2 nm is formed on the second active region 100b.

Figure 4A:
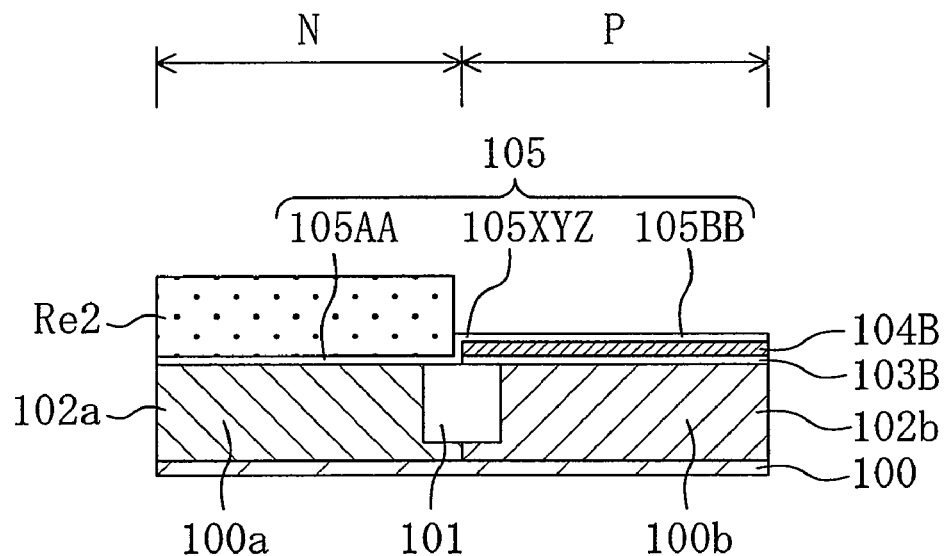
FIGS. 4A to 4C are cross-sectional views showing major steps of the method for manufacturing the semiconductor device of the first embodiment of the present invention in the order in which the device is manufactured, as the device is viewed in a gate width direction.

Next, as shown in FIG. 4A, after the resist Re1 is removed, a surface of the semiconductor substrate 100 is cleaned by a treatment with diluted hydrofluoric acid. Thereafter, a first insulating film 105 made of, for example, a high-k film having a film thickness of 2 nm is formed on an entire surface of the semiconductor substrate 100 by, for example, MOCVD (Metal Organic Chemical Vapor Deposition).

Figure 7:
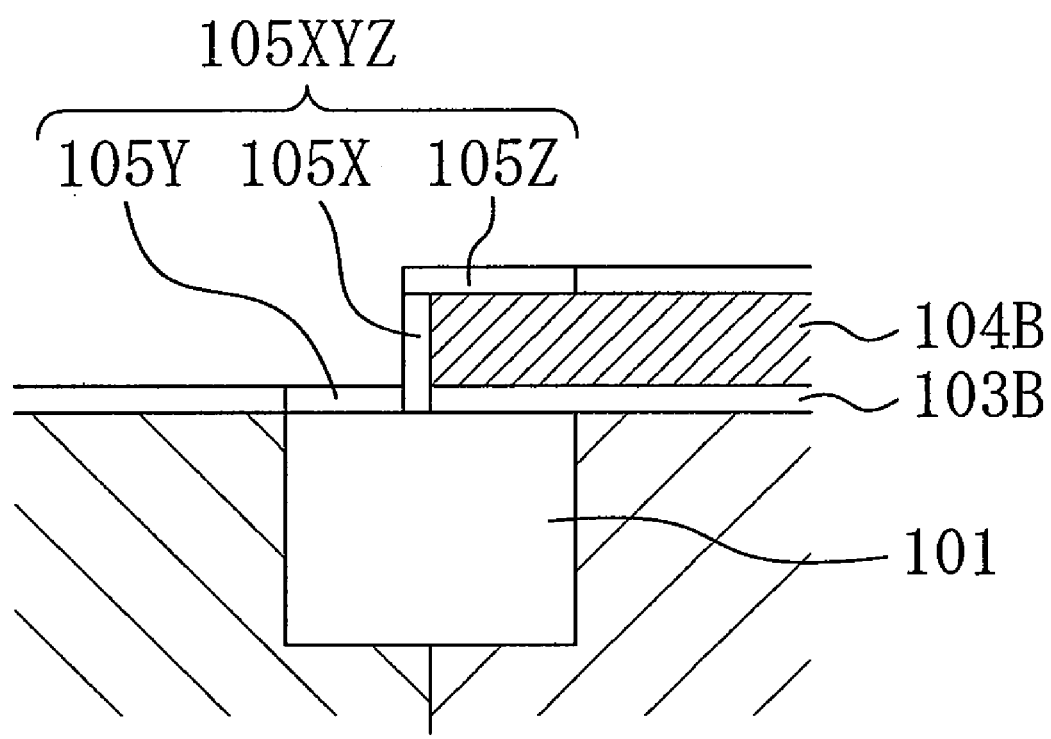
FIG. 7 is an enlarged, cross-sectional view of FIG. 4A.

In this case, as shown in FIG. 4A, the first insulating film 105 has first gate insulating film forming films 105AA and 105BB formed on the first and second active regions 100a and 100b, respectively, and a sidewall insulating film forming film 105XYZ formed on the isolation region 101. Here, as shown in FIG. 7, the sidewall insulating film forming film 105XYZ includes an insulating film 105Y formed on the isolation region 101 in the N-type MIS forming region, an insulating film 105X formed on a side surface of the first electrode forming film 104B, and an insulating film 105Z formed on the isolation region 101 in the P-type MIS forming region.

Thereafter, a resist Re2 is formed on the semiconductor substrate 100 by photolithography, covering the N-type MIS forming region while leaving the P-type MIS forming region exposed.

Figure 4B:
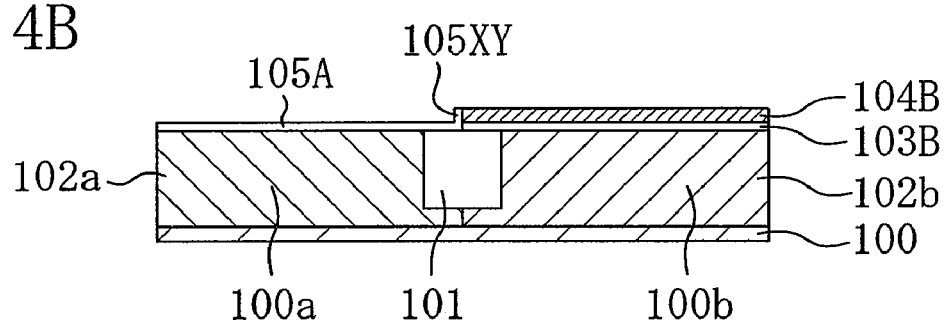

Next, as shown in FIG. 4B, a region exposed through the opening of the resist Re2 of the first insulating film 105 is removed by dry etching or wet etching using the resist Re2 as a mask, and thereafter, the resist Re2 is removed. In this case, the first insulating film (high-k film) 105 has etching characteristics different from those of the first electrode forming film (polysilicon film) 104B, so that only the first insulating film can be selectively removed.

Thus, as shown in FIG. 4B, the first gate insulating film forming film 105BB on the first electrode forming film 104B is removed, leaving a first gate insulating film forming film 105A on the first active region 100a, while a portion (see 105Z in FIG. 7) formed on the first electrode forming film 104B of the sidewall insulating film forming film 105XYZ is removed, leaving a sidewall insulating film forming film 105XY extending from an upper portion of the isolation region 101 in the N-type MIS forming region across a side surface of the first electrode forming film 104B (i.e., leaving an insulating film (see 105Y in FIG. 7) and an insulating film (see 105X in FIG. 7) of the sidewall insulating film forming film 105XYZ).

Figure 4C:
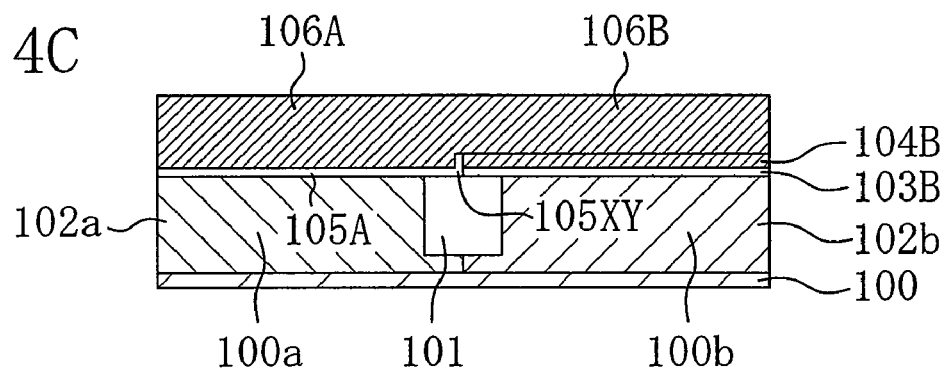

Next, as shown in FIG. 4C, a second electrode forming film made of, for example, a polysilicon film having a film thickness of 120 nm is deposited on an entire surface of the semiconductor substrate 100 by, for example, CVD, and thereafter, a surface of the second electrode forming film is subjected to planarization by chemical mechanical polishing (CMP). Thereby, a second electrode forming film 106A made of the polysilicon film having a film thickness of 100 nm is formed on the N-type MIS forming region in the semiconductor substrate 100, while a second electrode forming film 106B made of the polysilicon film having a film thickness of 80 nm is formed on the P-type MIS forming region in the semiconductor substrate 100.

Thus, as shown in FIG. 4C, the second electrode forming film 106A made of the polysilicon film having a film thickness of 100 nm is formed via the first gate insulating film forming film 105A made of the high-k film having a film thickness of 2 nm on the first active region 100a. On the other hand, the first electrode forming film 104B made of the polysilicon film having a film thickness of 20 nm and the second electrode forming film 106B made of the polysilicon film having a film thickness of 80 nm are successively formed via the second gate insulating film forming film 103B made of the silicon oxide film having a film thickness of 2 nm is formed on the second active region 100b.

Next, an n-type impurity, such as P (phosphor) or the like, is implanted into the second electrode forming film 106A in the N-type MIS forming region by lithography and ion implantation, and a p-type impurity, such as B (boron) or the like, is implanted into the second electrode forming film 106B and the first electrode forming film 104B in the P-type MIS forming region.

Figure 5A:
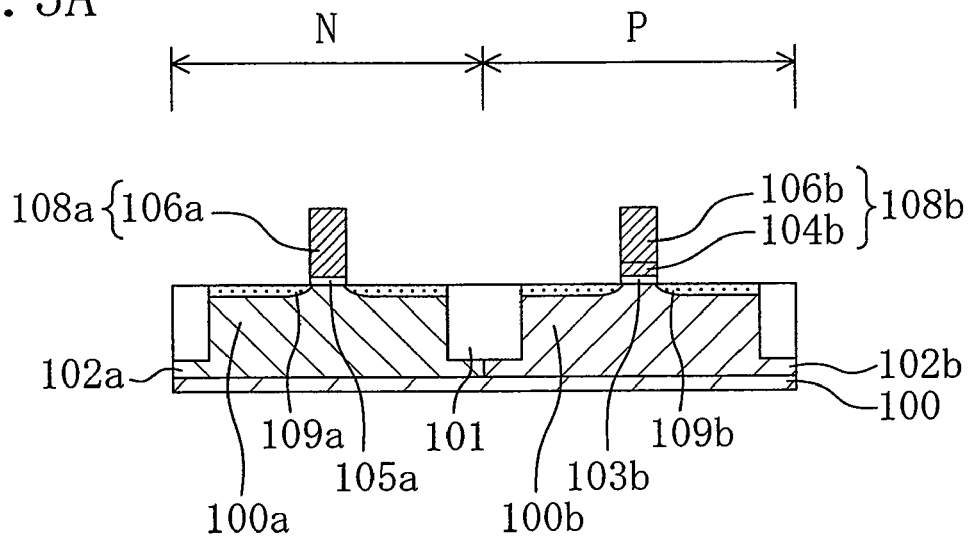
FIGS. 5A to 5C are cross-sectional views showing major steps of the method for manufacturing the semiconductor device of the first embodiment of the present invention in the order in which the device is manufactured, as the device is viewed in a gate length direction.

Next, as shown in FIG. 5A, the second electrode forming film 106A and the first gate insulating film forming film 105A on the first active region 100a are subjected to patterning by photolithography and dry etching to successively forming the first gate insulating film 105a and the second electrode 106a on the first active region 100a. On the other hand, the second electrode forming film 106B, the first electrode forming film 104B, and the second gate insulating film forming film 103B on the second active region 100b are subjected to patterning to successively forming the second gate insulating film 103b, and the first electrode 104b and the second electrode 106b on the second active region 100b.

Thus, the first gate electrode 108a including the second electrode 106a is formed via the first gate insulating film 105a on the first active region 100a, while the second gate electrode 108b including the first electrode 104b and the second electrode 106b which are successively laminated is formed via the second gate insulating film 103b on the second active region 100b.

In this case, the sidewall insulating film forming film 105XY is also subjected to patterning, so that a sidewall insulating film (see 105xy in FIG. 2B described above) including the sidewall insulating film forming film 105XY is formed on the isolation region 101, though this is not illustrated in FIG. 5A, since FIG. 5A is the cross-sectional view in the gate length direction.

Thereafter, an n-type impurity is implanted into the first active region 100a by ion implantation using the first gate electrode 108a as a mask, thereby forming the first extension region 109a outside the first gate electrode 108a in the first active region 100a in a self-aligned manner. On the other hand, a p-type impurity is implanted into the second active region 100b using the second gate electrode 108b as a mask, thereby forming the second extension region 109b outside the second gate electrode 108b in the second active region 100b in a self-aligned manner.

Figure 5B:
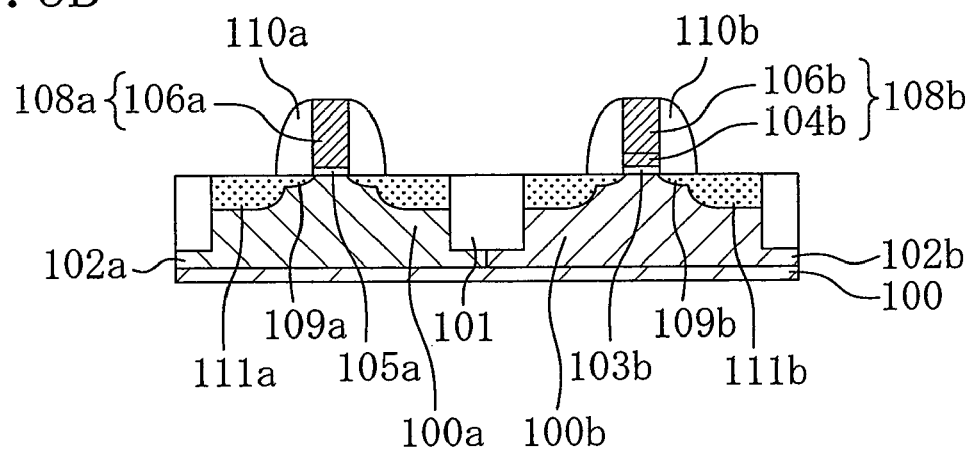

Next, as shown in FIG. 5B, a silicon nitride film having a film thickness of, for example, 50 nm is deposited on an entire surface of the semiconductor substrate 100 by, for example, CVD, covering the first and second gate electrodes 108a and 108b, and thereafter, the silicon nitride film is subjected to anisotropic etching, thereby forming the first and second sidewalls 110a and 110b made of the silicon nitride film on side surfaces of the first and second gate electrodes 108a and 108b, respectively.

Thereafter, an n-type impurity is implanted into the first active region 100a by ion implantation using the first gate electrode 108a and the first sidewall 110a as a mask, and a p-type impurity is implanted into the second active region 100b using the second gate electrode 108b and the second sidewall 110b as a mask. Thereafter, by a thermal treatment, the first source/drain region 111a having a junction portion deeper than that of the first extension region 109a is formed outside the first sidewall 110a in first active region 100a in a self-aligned manner, while the second source/drain region 111b having a junction portion deeper than that of the second extension region 109b is formed outside the second sidewall 110b in the second active region 100b in a self-aligned manner.

Figure 5C:
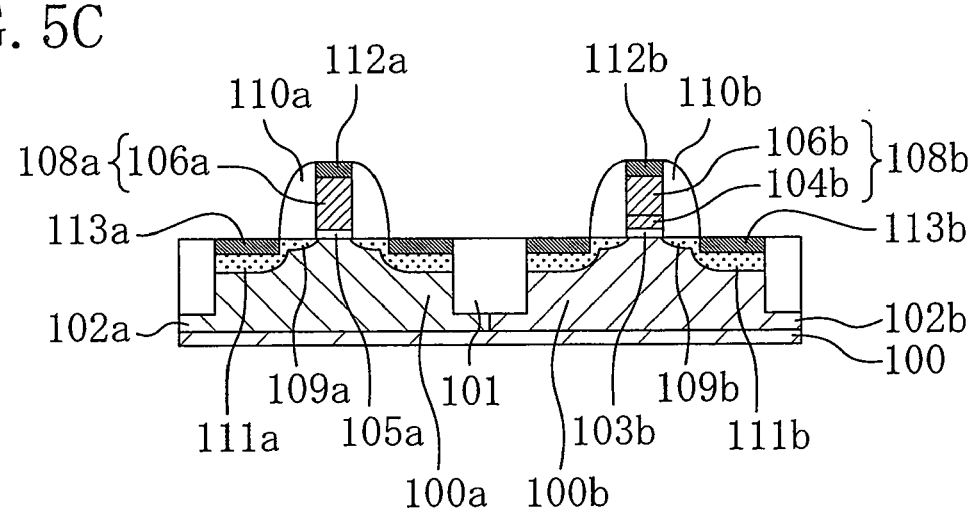

Next, as shown in FIG. 5C, a natural oxide film (not shown) formed on surfaces of the first and second gate electrodes 108a and 108b and the first and second source/drain regions 111a and 111b is removed. Thereafter, a metal film (not shown) made of, for example, nickel having a film thickness of 10 nm is deposited on an entire surface of the semiconductor substrate 100 by, for example, sputtering, covering the first and second gate electrodes 108a and 108b and the first and second sidewalls 110a and 110b.

Thereafter, for example, by performing a first RTA (Rapid Thermal Annealing) treatment in an atmosphere of nitrogen and at 320° C., Si in the first and second gate electrodes 108a and 108b and Ni in the metal film are caused to react with each other, thereby forming the first and second silicide layers 112a and 112b made of a nickel silicide film in upper portions of the first and second gate electrodes 108a and 108b, while Si in the first and second source/drain regions 111a and 111b and Ni in the metal film are caused to react with each other, thereby forming the third and fourth silicide layers 113a and 113b made of a nickel silicide film in upper portions of the first and second source/drain regions 111a and 111b.

Thereafter, the semiconductor substrate 100 is immersed in an etchant which is a mixture of sulfuric acid and hydrogen peroxide solution to remove an unreacted metal film remaining on the isolation region 101, the first and second sidewalls 110a and 110b, and the like. Thereafter, by a second RTA treatment at a temperature (e.g., 550° C.) higher than that of the first RTA treatment, the silicide composition ratios of the first and second silicide layers 112a and 112b and the third and fourth silicide layers 113a and 113b are stabilized.

Figure 6A:
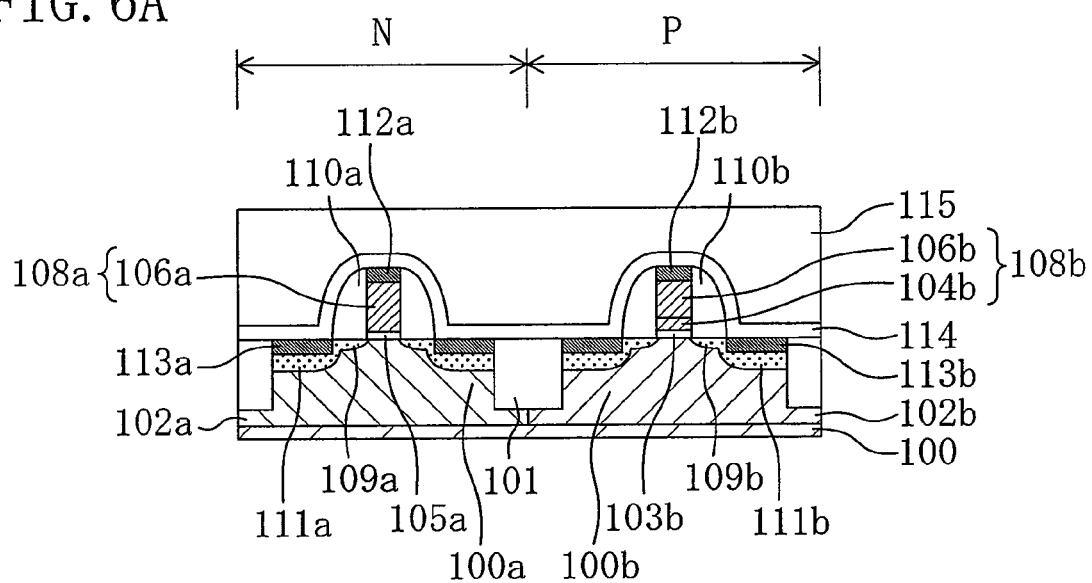
FIGS. 6A and 6B are cross-sectional views showing major steps of the method for manufacturing the semiconductor device of the first embodiment of the present invention in the order in which the device is manufactured, as the device is viewed in a gate length direction.

Next, as shown in FIG. 6A, the underlying insulating film 114 made of, for example, a silicon nitride film is formed on an entire surface of the semiconductor substrate 100, covering the first and second gate electrodes 108a and 108b and the first and second sidewalls 110a and 110b. Thereafter, the interlayer insulating film 115 made of, for example, a silicon oxide film is formed on the underlying insulating film 114, followed by planarization of a surface of the interlayer insulating film 115 by CMP.

Figure 6B:
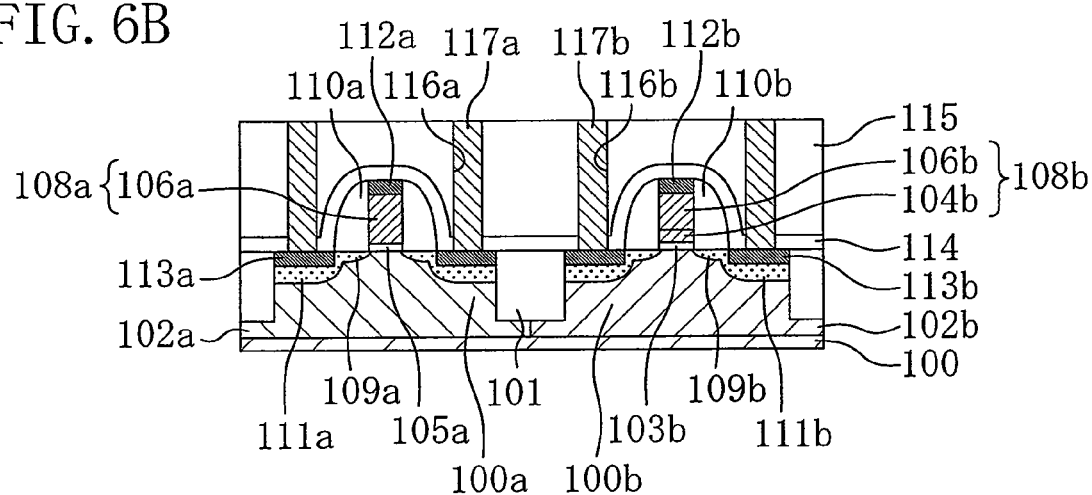

Next, as shown in FIG. 6B, after a resist (not shown) is formed on the interlayer insulating film 115, holes through which an upper surface of the underlying insulating film 114 is exposed are formed in the interlayer insulating film 115 by first dry etching employing the resist as a mask. Thereafter, portions of the underlying insulating film 114 which are exposed in the hole are removed by second dry etching, so that first and second contact holes 116a and 116b which reach upper surfaces of the third and fourth silicide layers 113a and 113b, respectively, are formed in the underlying insulating film 114 and the interlayer insulating film 115. Thus, the amount of overetching in the third and fourth silicide layers 113a and 113b can be reduced by two-step etching.

Thereafter, a barrier metal film in which a titanium film and a titanium nitride film are successively laminated is formed in bottom portions and sidewall portions of the first and second contact holes 116a and 116b by sputtering or CVD. Thereafter, a tungsten film is deposited on the interlayer insulating film 115 by CVD, filling the first and second contact holes 116a and 116b. Thereafter, a portion of the tungsten film formed outside the first and second contact holes 116a and 116b is removed by CMP. Thereby, the first and second contact plugs 117a and 117b in which the tungsten film is buried via the barrier metal film is formed in the first and second contact holes 116a and 116b, respectively. Thereafter, metal wiring (not shown) which is electrically connected to the first and second contact plugs 117a and 117b is formed on the interlayer insulating film 115.

Thus, the semiconductor device of this embodiment can be manufactured.

According to this embodiment, as shown in FIG. 4A, the first gate insulating film forming film 105BB is formed via the first electrode forming film 104B on the second gate insulating film forming film 103B. Therefore, when the first gate insulating film forming film 105BB on the first electrode forming film 104B is removed, the second gate insulating film forming film 103B is prevented from being damaged by etching. Note that only the first gate insulating film forming film 105BB on the first electrode forming film 104B can be selectively removed while leaving the first gate insulating film forming film 105A on the first active region 10a.

Also, according to this embodiment, as shown in FIG. 3C, since the resist Re1 is formed via the first electrode forming film 104B on the second gate insulating film forming film 103B, the second gate insulating film forming film 103B is prevented from being damaged when the resist Re1 is removed.

Therefore, the first and second gate insulating films 105a and 103b made of insulating materials differing between the N-type MIS transistor and the P-type MIS transistor can be formed with high accuracy, thereby making it possible to provide N- and P-type MIS transistors having desired device characteristics.

Although a specific example in which a high-k film is used as the first gate insulating film 105a and a silicon oxide film is used as the second gate insulating film 103b has been described in this embodiment, the present invention is not limited to this. For example, first and second gate insulating films having different composition ratios may be used.

Also, although a specific example in which the first and second gate insulating films 105a and 103b have the same film thickness has been described in this embodiment, the present invention is not limited to this. For example, first and second gate insulating films having different film thicknesses may be used. Thereby, gate insulating films can be individually optimized in the N-type MIS transistor and the P-type MIS transistor, resulting in an increase in design margin.

Also, although a specific example in which a silicon oxide film is used as the second gate insulating film 103b has been described in this embodiment, the present invention is not limited to this. For example, a silicon oxynitride film may be used.

Also, particularly, the high-k film preferably has a relative permittivity of 10 or more and is preferably made of a metal oxide. Specific examples of the high-k film include a high-k film including at least one of hafnium oxides (e.g., hafnium oxide ($HfO_2$), hafnium silicate (HfSiO), hafnium silicate nitride (HfSiON), etc.), and oxides of tantalum (Ta), zirconium (Zr), titanium (Ti), aluminum (Al), scandium (Sc), yttrium (Y), and lanthanum (La).

Also, in this embodiment that a first silicon film made of, for example, polysilicon is used as the first electrode forming films 104 and 104B, and a second silicon film made of, for example, polysilicon is used as the second electrode forming films 106A and 106B. Alternatively, the first and second silicon films may be made of other semiconductor materials including, for example, amorphous silicon, silicon, or the like.

Also, it has been described above that a metal film made of nickel is used to react with the upper portions of the first and second source/drain regions 111a and 111b and the upper portions of the first and second gate electrodes 108a and 108b during the step of forming the first and second silicide layers 112a and 112b and the third and fourth silicide layers 113a and 113b. Alternatively, platinum, cobalt, titanium, tungsten or the like, may be used as a metal for silicidation.

Also, it has been described above that a monolayer film made of a silicon nitride film is used as the first and second sidewalls 110a and 110b. Alternatively, a multilayer film in which, for example, a silicon oxide film and a silicon nitride film are successively laminated may be used.

Also, a specific example has been described in this embodiment in which, as shown in FIG. 4C, the second electrode forming film is deposited on the entire surface of the semiconductor substrate 100, and thereafter, the surface of the second electrode forming film is subjected to planarization by CMP, so that a difference in level between the second electrode forming film 106B formed on the second active region 100b and the second electrode forming film 106A formed on the first active region 100a is reduced. The present invention is not limited to this.

For example, in the step of FIG. 3B, the first electrode forming film 104 may be caused to be sufficiently thin (e.g., 10 nm or less). In this case, since the difference in level between the second electrode forming film 106B formed on the second active region 100b and the second electrode forming film 106A formed on the first active region 100a can be reduced, the planarization of the surface of the second electrode forming film is not required after the second electrode forming film is deposited on the entire surface of the semiconductor substrate 100.

Second Embodiment

Hereinafter, a method for manufacturing a semiconductor device according to a second embodiment of the present invention will be described with reference to FIGS. 8A to 8D. FIGS. 8A to 8D are cross-sectional views showing major steps of the manufacturing method in the order in which the device is manufactured, as the device is viewed in a gate width direction. Note that, in these figures, an N-type MIS forming region N is shown on the left side and a P-type MIS forming region P is shown on the right side. Here, in FIGS. 8A to 8D, the same parts as those of the semiconductor device of the first embodiment above are indicated by the same reference symbols and will not be described.

Firstly, the above-described steps of FIGS. 3A and 3B are successively performed. Note that a first electrode forming film 104 made of a polysilicon film is formed to have a film thickness of 40 nm, which is thicker than that of the first embodiment.

Figure 8A:
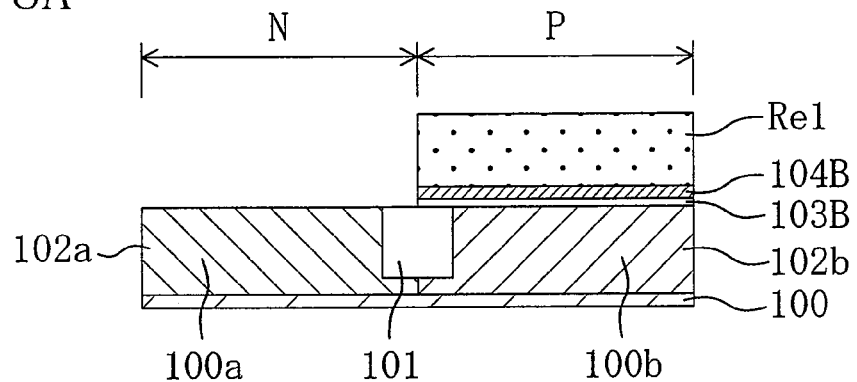
FIGS. 8A to 8D are cross-sectional views showing major steps of a method for manufacturing a semiconductor device according to a second embodiment of the present invention in the order in which the device is manufactured, as the device is viewed in a gate width direction.

Next, as shown in FIG. 8A, portions formed in the N-type MIS forming region of the first electrode forming film and the second gate insulating film forming film are successively removed by dry etching using a resist Re1 as a mask (similar to the above-described step of FIG. 3C).

Thus, as shown in FIG. 8A, a first electrode forming film 104B made of a polysilicon film having a film thickness of 40 nm is formed via a second gate insulating film forming film 103B made of a silicon oxide film having a film thickness of 2 nm on a second active region 100b.

Figure 8B:
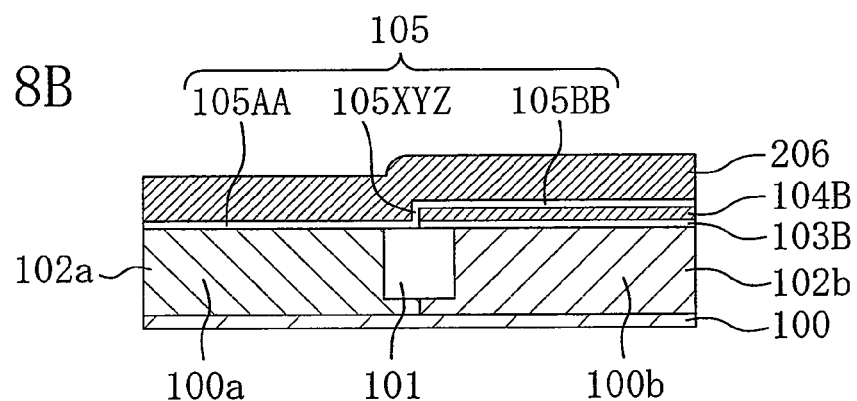

Next, as shown in FIG. 8B, after the resist Re1 is removed, a surface of the semiconductor substrate 100 is cleaned by a treatment with diluted hydrofluoric acid. Thereafter, a first insulating film 105 made of, for example, a high-k film having a film thickness of 2 nm is formed on an entire surface of the semiconductor substrate 100 by, for example, MOCVD. In this case, as shown in FIG. 8B, the first insulating film 105 has first gate insulating film forming films 105AA and 105BB formed on the first and second active regions 100a and 100b and a sidewall insulating film forming film 105XYZ formed on the isolation region 101. Thereafter, a second electrode forming film 206 made of, for example, a polysilicon film having a film thickness of 100 nm is formed on the first insulating film 105 by, for example, CVD.

Figure 8C:
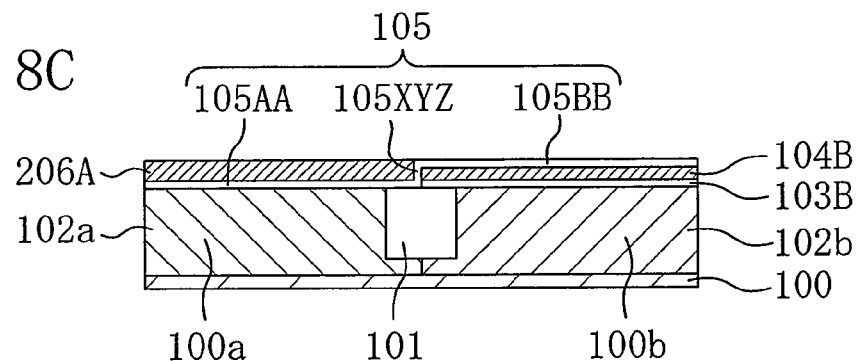

Next, as shown in FIG. 8C, the second electrode forming film 206 is polished and removed by, for example, CMP until an upper surface of a portion (specifically, the first gate insulating film forming film 105BB, the insulating film (see 105Z of FIG. 7)) formed on the first electrode forming film 104B of the first insulating film 105 is exposed. Thus, the second electrode forming film 206 formed on the first electrode forming film 104B (specifically, the first gate insulating film forming film 105BB) is removed, leaving a second electrode forming film 206A made of a polysilicon film having a film thickness of 40 nm on the first active region 100a.

Figure 8D:
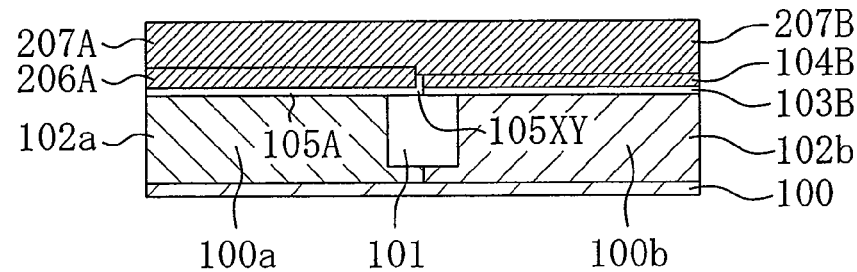

Next, as shown in FIG. 8D, a portion formed on the first electrode forming film 104B of the first insulating film 105 is removed by dry etching or wet etching having a large etching selection ratio with respect to a polysilicon film (the second electrode forming film 206A and the first electrode forming film 104B). Specifically, the first gate insulating film forming film 105BB formed on the first electrode forming film 104B is removed, leaving a first gate insulating film forming film 105A on the first active region 100a, and a portion (see 105Z of FIG. 7 described above) formed on the first electrode forming film 104B of the sidewall insulating film forming film 105XYZ is removed, leaving a sidewall insulating film forming film 105XY on the isolation region 101.

Thereafter, a third electrode forming film made of, for example, a polysilicon film having a film thickness of 60 nm is deposited on an entire surface of the semiconductor substrate 100 by, for example, CVD. Thereby, a third electrode forming film 207A made of the polysilicon film having a film thickness of 60 nm is formed on the N-type MIS forming region in the semiconductor substrate 100, while a third electrode forming film 207B made of the polysilicon film having a film thickness of 60 nm is formed on the P-type MIS forming region in the semiconductor substrate 100.

Thus, as shown in FIG. 8D, the second electrode forming film 206A made of a polysilicon film having a film thickness of 40 nm and the third electrode forming film 207A made of a polysilicon film having a film thickness of 60 nm are successively formed via the first gate insulating film forming film 105A made of a high-k film having a film thickness of 2 nm on the first active region 100a. On the other hand, the first electrode forming film 104B made of a polysilicon film having a film thickness of 40 nm and the third electrode forming film 207B made of a polysilicon film having a film thickness of 60 nm are successively formed via the second gate insulating film forming film 103B made of a silicon oxide film having a film thickness of 2 nm on the second active region 100b.

Next, by lithography and ion implantation, an n-type impurity, such as P (phosphor) or the like, is implanted into the third electrode forming film 207A and the second electrode forming film 206A in the N-type MIS forming region, and a p-type impurity, such as B (boron) or the like, is implanted into the third electrode forming film 207B and the first electrode forming film 104B in the P-type MIS forming region.

Next, the third electrode forming films 207A, the second electrode forming film 206A, and the first gate insulating film forming film 105A on the first active region 100a are subjected to patterning by photolithography and dry etching, thereby successively forming a first gate insulating film made of the first gate insulating film forming film 105A, a third electrode made of the second electrode forming film 206A, and a fourth electrode made of the third electrode forming film 207A on the first active region 100a. On the other hand, the third electrode forming film 207B, the first electrode forming film 104B, and the second gate insulating film forming film 103B on the second active region 100b are subjected to patterning, thereby successively forming a second gate insulating film made of the second gate insulating film forming film 103B, a first electrode made of the first electrode forming film 104B, and a second electrode made of the third electrode forming film 207B on the second active region 100b.

In this case, the sidewall insulating film forming film 105XY is also subjected to patterning, thereby forming a sidewall insulating film (see 105xy of FIG. 21 described below) made of the sidewall insulating film forming film 105XY on the isolation region 101. Specifically, the sidewall insulating film is formed between the third electrode and the first electrode, and is made of the same insulating material as that of the first gate insulating film. The fourth electrode and the second electrode are integrally formed.

Thus, a first gate electrode in which the third electrode (made of the second electrode forming film 206A) and the fourth electrode (made of the third electrode forming film 207A) are successively laminated is formed via the first gate insulating film on the first active region 100a, and a second gate electrode in which the first electrode (made of the first electrode forming film 104B) and the second electrode (made of the third electrode forming film 207B) are successively laminated is formed via the second gate insulating film on the second active region 100b.

Also, the sidewall insulating film is formed between the third electrode and the first electrode, and the fourth electrode and the second electrode are integrally formed. Therefore, upper regions of the first gate electrode and the second gate electrode are electrically connected to each other on the isolation region 101, while lower regions thereof are separated from each other with the sidewall insulating film being interposed therebetween.

Next, the above-described steps shown in FIGS. 5A to 5C and 6A and 6B are successively performed.

Thus, the semiconductor device of this embodiment can be manufactured.

According to this embodiment, an effect similar to that of the first embodiment can be obtained. Specifically, in the step of FIG. 8C, only the first gate insulating film forming film 105BB on the first electrode forming film 104B can be selectively removed. Also, in the step of FIG. 8A, the second gate insulating film forming film 103B can be prevented from being damaged by the removal of the resist Re1.

In addition, according to this embodiment, as shown in FIG. 8C, the first gate insulating film forming film 105BB on the first electrode forming film 104B is removed in a state in which the second electrode forming film 206A is formed on the first gate insulating film forming film 105AA. Therefore, the resist Re2 (see FIG. 4A described above) of the first embodiment is not required, so that the first gate insulating film forming film 105A is not likely to be damaged by the removal of the resist Re2, as is different from the first embodiment.

Therefore, it is possible to form the first and second gate insulating films having insulating materials differing between the N-type MIS transistor and the P-type MIS transistor with higher accuracy, resulting in N- and P-type MIS transistors having desired device characteristics.

Third Embodiment

Hereinafter, a method for manufacturing a semiconductor device according to a third embodiment of the present invention will be described with reference to FIGS. 9A to 9D. FIGS. 9A to 9D are cross-sectional views showing major steps of the manufacturing method in the order in which the device is manufactured, as the device is viewed in a gate width direction. Note that, in these figures, an N-type MIS forming region N is shown on the left side and a P-type MIS forming region P is shown on the right side. Here, in FIGS. 9A to 9D, the same parts as those of the semiconductor device of the first embodiment above are indicated by the same reference symbols and will not be described.

Firstly, the above-described step of FIG. 3A is performed.

Figure 9A:
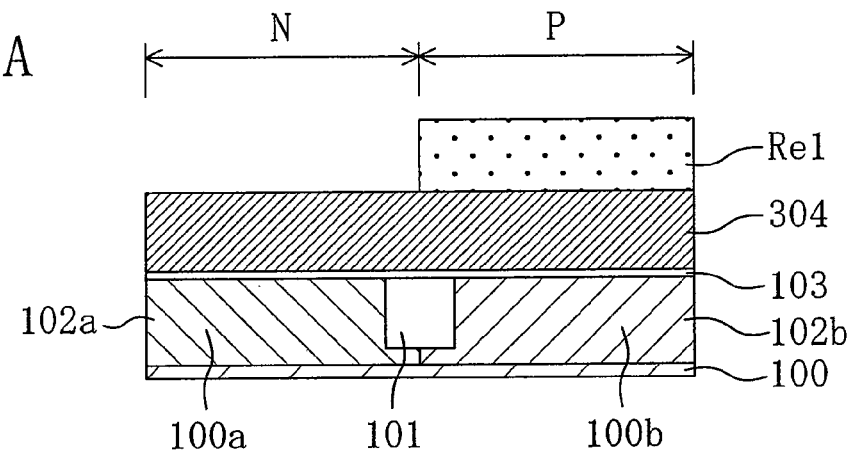
FIGS. 9A to 9D are cross-sectional views showing major steps of a method for manufacturing a semiconductor device according to a third embodiment of the present invention in the order in which the device is manufactured, as the device is viewed in a gate width direction.

Next, as shown in FIG. 9A, after a surface of the semiconductor substrate 100 is cleaned by a treatment with diluted hydrofluoric acid, a second gate insulating film forming film 103 made of, for example, a silicon oxide film having a film thickness of 2 nm is formed on first and second active regions 100a and 100b by, for example, ISSG. Thereafter, a first electrode forming film 304 made of, for example, polysilicon having a film thickness of 100 nm is deposited on the second gate insulating film forming film 103 by, for example, CVD, and thereafter, a resist Re1 is formed on the semiconductor substrate 100 by photolithography, covering the P-type MIS forming region while leaving the N-type MIS forming region exposed.

Figure 9B:
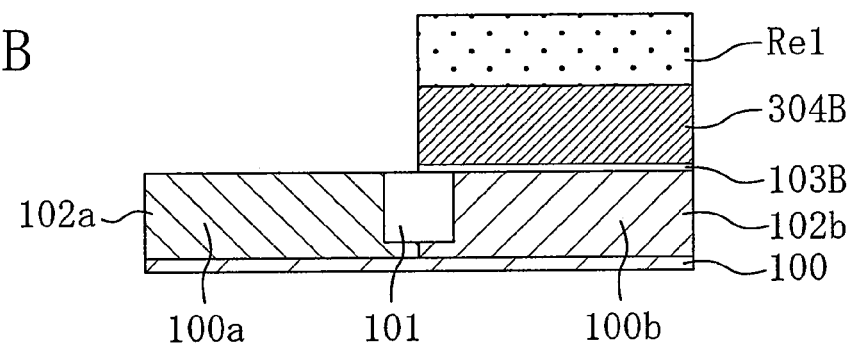

Next, as shown in FIG. 9B, portions formed in the N-type MIS forming region of the first electrode forming film 304 and the second gate insulating film forming film 103 are successively removed by dry etching using the resist Re1 as a mask.

Thus, as shown in FIG. 9B, a first electrode forming film 304B made of the polysilicon film having a film thickness of 100 nm is formed via a second gate insulating film forming film 103B made of the silicon oxide film having a film thickness of 2 nm on the second active region 100b.

Figure 9C:
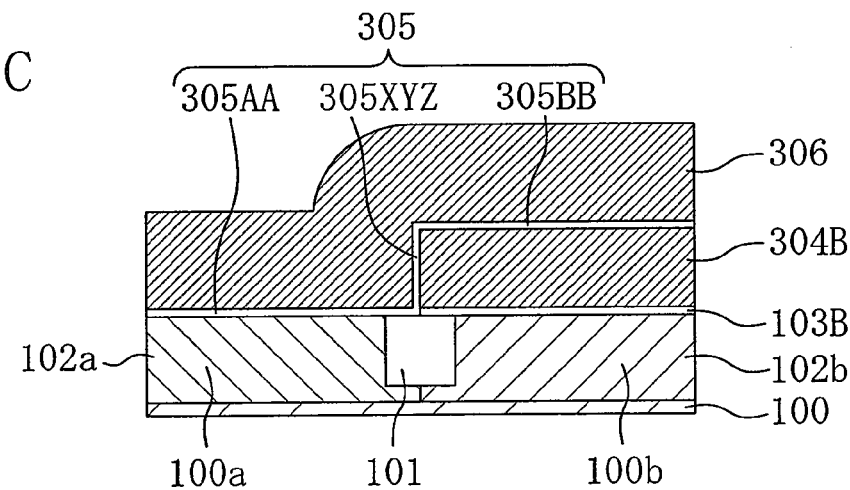

Next, as FIG. 9C, after the resist Re1 is removed, a surface of the semiconductor substrate 100 is cleaned by a treatment with diluted hydrofluoric acid. Thereafter, a first insulating film 305 made of, for example, a high-k film having a film thickness of 2 nm is formed on an entire surface of the semiconductor substrate 100 by, for example, MOCVD.

In this case, as shown in FIG. 9C, the first insulating film 305 has first gate insulating film forming films 305AA and 305BB formed on the first and second active regions 100a and 100b, respectively, and a sidewall insulating film forming film 305XYZ formed on the isolation region 101. Here, the sidewall insulating film forming film 305XYZ includes an insulating film (see 105Y of FIG. 7 described above) formed on isolation region 101 in the N-type MIS forming region, an insulating film (see 105X of FIG. 7 described above) formed on a side surface of the first electrode forming film 304B, and an insulating film (see 105Z of FIG. 7 described above) formed on the isolation region 101 in the P-type MIS forming region.

Thereafter, a second electrode forming film 306 made of, for example, a polysilicon film having a film thickness of 140 nm is deposited on an entire surface of the semiconductor substrate 100 by, for example, CVD.

Figure 9D:
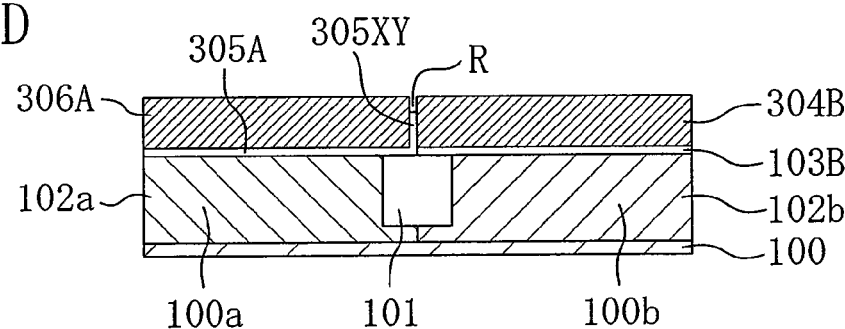

Next, as shown in FIG. 9D, the second electrode forming film 306 is polished and removed by, for example, CMP until an upper surface of a region formed on the first electrode forming film 304B of the first insulating film 305 is exposed. Thus, the second electrode forming film 306 on the first electrode forming film 304B is removed (specifically, the first gate insulating film forming film 305BB), leaving a second electrode forming film 306A made of the polysilicon film having a film thickness of 100 nm on the first active region 100a.

Thereafter, by dry etching or wet etching having a large etching selection ratio with respect to a polysilicon film (the second electrode forming film 306A and the first electrode forming film 304B), a portion formed on the first electrode forming film 304B of the first insulating film 305 is removed. Specifically, the first gate insulating film forming film 305BB on the first electrode forming film 304B is removed, leaving a first gate insulating film forming film 305A on the first active region 100a, and a portion (see 105Z of FIG. 7 described above) formed on the first electrode forming film 304B of the sidewall insulating film forming film 305XYZ is removed, leaving a sidewall insulating film forming film 305XY on the isolation region 101.

Thereafter, by further dry etching or wet etching, an upper portion of the sidewall insulating film forming film 305XY is removed so that the height of an upper surface of the sidewall insulating film forming film 305XY is caused to be lower than the heights of upper surfaces of the first and second electrode forming films 304B and 306A, and a groove R having a depth of, for example, 20 nm is formed between the second electrode forming film 306A and the first electrode forming film 304B. In this case, since the sidewall insulating film forming film (high-k film) 305XY has etching characteristics different from those of the first and second electrode forming films (polysilicon films) 304B and 306A, only the sidewall insulating film forming film 305XY can be selectively removed.

Thus, as shown in FIG. 9D, the second electrode forming film 306A made of a polysilicon film having a film thickness of 100 nm is formed via the first gate insulating film forming film 305A made of a high-k film having a film thickness of 2 nm on the first active region 100a. On the other hand, the first electrode forming film 304B made of a polysilicon film having a film thickness of 100 nm is formed via the second gate insulating film forming film 103B made of a silicon oxide film having a film thickness of 2 nm on the second active region 100b.

Next, by lithography and ion implantation, an n-type impurity, such as P (phosphor) or the like, is implanted into the second electrode forming film 306A in the N-type MIS forming region, and a p-type impurity, such as B (boron) or the like, is implanted into the first electrode forming film 304B in the P-type MIS forming region.

Next, the second electrode forming film 306A and the first gate insulating film forming film 305A on the first active region 100a are subjected to patterning by photolithography and dry etching, thereby successively forming a first gate insulating film (see 305a in FIG. 10 described below) made of the first gate insulating film forming film 305A, and a second electrode (see 306a of FIG. 10 described below) made of the second electrode forming film 306A on the first active region 100a. On the other hand, the first electrode forming film 304B and the second gate insulating film forming film 103B on the second active region 100b are subjected to patterning, thereby successively forming a second gate insulating film (see 103b of FIG. 10 described below) made of the second gate insulating film forming film 103B, and a first electrode (see 304b of FIG. 10 described below) made of the first electrode forming film 304B on the second active region 100b.

In this case, the sidewall insulating film forming film 305XY is also subjected to patterning, thereby forming a sidewall insulating film (see 305xy in FIG. 10 described below) made of the sidewall insulating film forming film 305XY on the isolation region 101. Specifically, the sidewall insulating film is formed, extending from an upper surface of the isolation region 101 through a space between the first electrode and the second electrode in the N-type MIS forming region. The sidewall insulating film is made of the same insulating material as that of the first gate insulating film.

Thus, a first gate electrode made of the second electrode (made of the second electrode forming film 306A) is formed via the first gate insulating film on the first active region 100a, while a second gate electrode made of the first electrode (made of the first electrode forming film 304B) is formed via the second gate insulating film on the second active region 100b.

Next, the steps of FIGS. 5A to 5C and 6A and 6B are successively described.

Thus, the semiconductor device of this embodiment can be manufactured.

Here, in this embodiment, in the step of FIG. 9D, an upper portion of the sidewall insulating film forming film 305XY is removed, and a groove R is formed between the second electrode forming film 306A and the first electrode forming film 304B. Therefore, a groove is formed between the second electrode made of the first gate electrode and the second gate electrode made of the first electrode, which will be formed in a subsequent patterning step.

Therefore, a subsequent silicidation step can be performed in a state in which a silicide forming metal film is formed on the semiconductor substrate 100, filling the groove formed between the first gate electrode and the second gate electrode. Therefore, when the volumes of a first silicide layer (see 312a in FIG. 10 described below) which is formed in an upper portion of the first gate electrode in the silicidation step and a second silicide layer (see 312b in FIG. 10 described below) which is formed in an upper portion of the second gate electrode are expanded, the first silicide layer and the second silicide layer can be caused to contact each other in the groove, so that the first gate electrode and the second gate electrode can be reliably electrically connected to each other.

Figure 10:
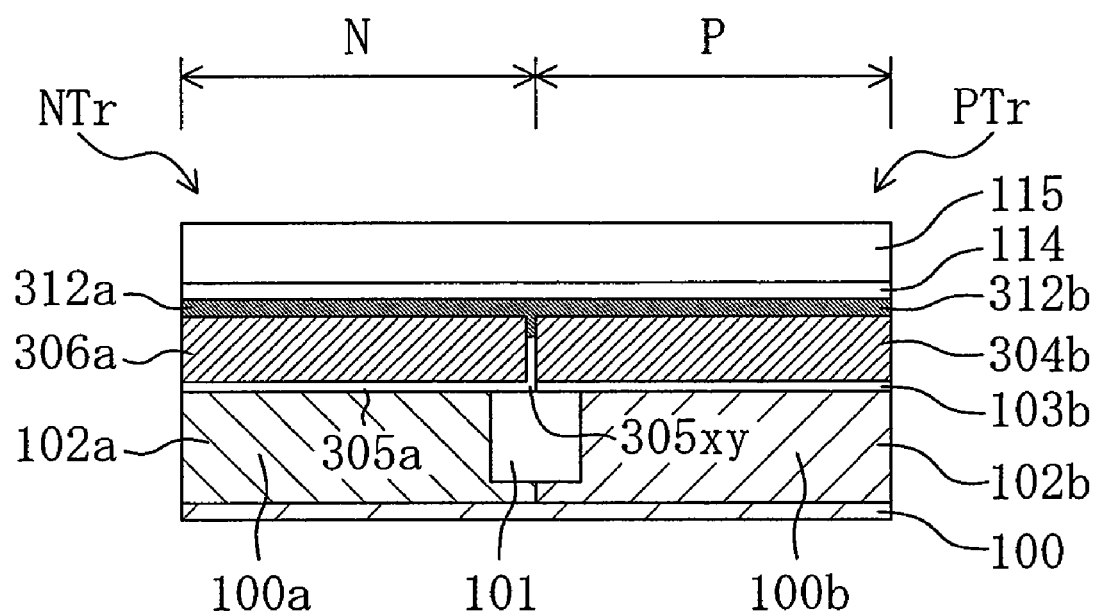
FIG. 10 is a cross-sectional view showing a structure of the semiconductor device of the third embodiment of the present invention as viewed in a gate width direction.

Hereinafter, a structure of the semiconductor device of the third embodiment of the present invention will be described with reference to FIG. 10. FIG. 10 is a cross-sectional view showing a structure of the semiconductor device of the third embodiment of the present invention as viewed in a gate width direction. Note that, in the figure, an N-type MIS forming region N is shown on the left side and a P-type MIS forming region P is shown on the right side. In FIG. 10, the same parts as those of the semiconductor device of the first embodiment above are indicated by the same reference symbols and will not be described.

As shown in FIG. 10, the sidewall insulating film 305xy having an L-shaped cross-section and made of the same insulating material as that of the first gate insulating film 305a is formed, extending from an upper surface of the isolation region 101 in the N-type MIS forming region through a space between the first gate electrode made of the second electrode 306a and the second gate electrode made of the first electrode 304b. The first silicide layer 312a and the second silicide layer 312b are formed, contacting each other on the sidewall insulating film 305xy. Thus, on the isolation region 101, upper regions of the first gate electrode and the second gate electrode are electrically connected to each other, while lower regions thereof are separated from each other with the sidewall insulating film 305xy being interposed therebetween.

According to this embodiment, an effect similar to that of the first embodiment can be obtained. Specifically, in the step of FIG. 9D, only the first gate insulating film forming film 305BB on the first electrode forming film 304B can be selectively removed. Also, in the step of FIG. 9B, the second gate insulating film forming film 103B can be prevented from being damaged by the removal of the resist Re1.

In addition, according to this embodiment, as shown in FIG. 9D, the first gate insulating film forming film 305BB on the first electrode forming film 304B is removed in a state in which the second electrode forming film 306A is formed on the first gate insulating film forming film 305AA. Therefore, as in the second embodiment, the resist Re2 used in the first embodiment (see FIG. 4A described above) is not required, so that the first gate insulating film forming film 305A is not likely to be damaged by the removal of the resist Re2, as is different from the first embodiment.

Therefore, the first and second gate insulating films made of insulating materials differing between the N-type MIS transistor and the P-type MIS transistor can be formed with higher accuracy, thereby making it possible to provide N- and P-type MIS transistors having desired device characteristics.

Further, according to this embodiment, as shown in FIG. 9D, the groove R is provided between the second electrode forming film 306A and the first electrode forming film 304B (note that the first and second electrode forming films 304B and 306A will be both subjected to patterning after implantation of conductivity-type impurities to become second and first gate electrodes). Therefore, the n-type impurity implanted in the second electrode forming film 306A can be prevented from being diffused into the first electrode forming film 304B, while the p-type impurity implanted in the first electrode forming film 304B can be prevented from being diffused into the second electrode forming film 306A.

Specifically, as in the first embodiment, the n-type impurity implanted in the second electrode forming film 106A and the p-type impurity implanted in the second electrode forming film 106B are not likely to be diffused into the second electrode forming film 106B and the second electrode forming film 106A, respectively, through a contact region therebetween. Similarly, as in the second embodiment, the n-type impurity implanted in the third electrode forming film 207A and the p-type impurity implanted in the third electrode forming film 207B are not likely to be diffused into the third electrode forming film 207B and the third electrode forming film 207A, respectively, through a contact region therebetween.

Fourth Embodiment

Hereinafter, a method for manufacturing a semiconductor device according to a fourth embodiment of the present invention will be described with reference to FIGS. 11A to 11C and 12A to 12C. FIGS. 11A to 11C and 12A to 12C are cross-sectional views showing major steps of the manufacturing method in the order in which the device is manufactured, as the device is viewed in a gate width direction. Note that, in these figures, a second n-type MIS forming region n and a first N-type MIS forming region N are shown on the left side, while a first P-type MIS forming region P and a second p-type MIS forming region p are shown on the right side. Here, in FIGS. 11A to 11C and 12A to 12C, the same parts as those of the semiconductor device of the first embodiment above are indicated by the same reference symbols and will not be described.

Here, a difference between the first embodiment and this embodiment is as follows.

In the first embodiment, a specific example has been described in which a semiconductor device comprises only the N-type MIS transistor NTr having the first gate insulating film 105a (thin film) formed in an internal circuit region, and the P-type MIS transistor PTr having the second gate insulating film 103b (thin film) formed in the internal circuit region. In this embodiment, a specific example will be described in which a semiconductor device comprises, in addition to the N-type MIS transistor NTr and the P-type MIS transistor PTr, an N-type MIS transistor nTr having a third gate insulating film (thick film) formed in a peripheral circuit region, and a P-type MIS transistor pTr having a third gate insulating film (thick film) formed in a peripheral circuit region, will be described.

Figure 11A:
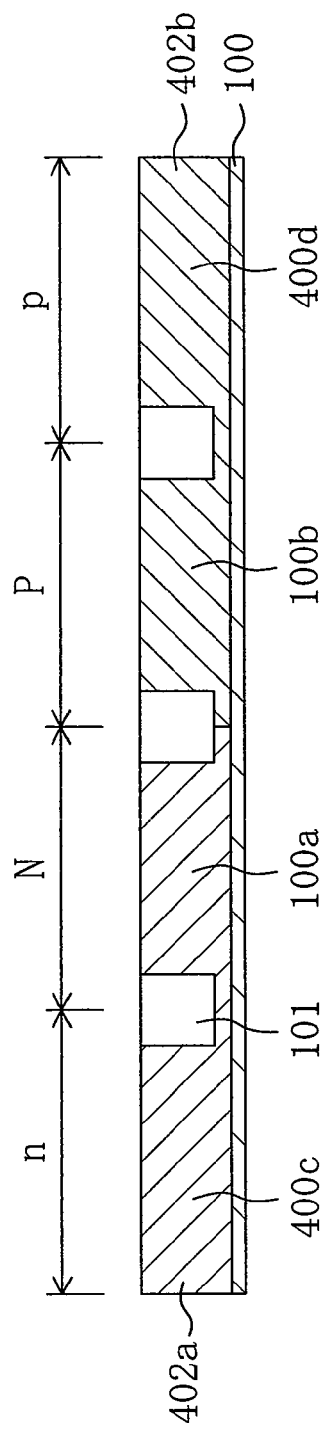
FIGS. 11A to 11C are cross-sectional views showing major steps of a method for manufacturing a semiconductor device according to a fourth embodiment of the present invention in the order in which the device is manufactured, as the device is viewed in a gate width direction.

Firstly, as shown in FIG. 11A, an isolation region 101 in which an insulating film is buried in a trench is selectively formed in an upper portion of a semiconductor substrate 100 made of, for example, p-type silicon by, for example, STI. Thereby, a third active region 400c made of the semiconductor substrate 100 surrounded by the isolation region 101 is formed in the second n-type MIS forming region, and a first active region 100a made of the semiconductor substrate 100 surrounded by the isolation region 101 is formed in the first N-type MIS forming region. On the other hand, a second active region 100b made of the semiconductor substrate 100 surrounded by the isolation region 101 is formed in the first P-type MIS forming region, and a third active region 400d made of the semiconductor substrate 100 surrounded by the isolation region 101 is formed in the second p-type MIS forming region.

Thereafter, by lithography and ion implantation, a p-type impurity, such as B (boron) or the like, is implanted into the second n-type MIS forming region and the first N-type MIS forming region of the semiconductor substrate 100, and an n-type impurity, such as P (phosphor) or the like, is implanted into the first P-type MIS forming region and the second p-type MIS forming region of the semiconductor substrate 100. Thereafter, by a thermal treatment (e.g., 850° C., 30 sec), a p-type well region 402a is formed in the second n-type MIS forming region and the first N-type MIS forming region of the semiconductor substrate 100, while an n-type well region 402b is formed in the first P-type MIS forming region and the second p-type MIS forming region of the semiconductor substrate 100.

Figure 11B:
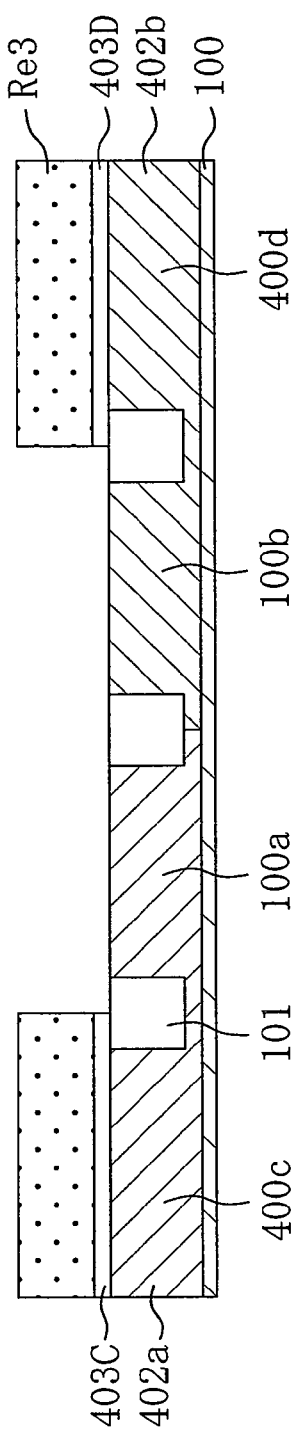

Next, as shown in FIG. 11B, after a surface of the semiconductor substrate 100 is cleaned by a treatment with diluted hydrofluoric acid, a third gate insulating film forming film made of, for example, a silicon oxide film having a film thickness of 7 nm is formed on the third, first, second, and third active regions 400c, 100a, 100b, and 400d. Thereafter, a resist Re3 is formed on the semiconductor substrate 100 by photolithography, covering the second n-type MIS forming region and the second p-type MIS forming region while leaving the first N-type MIS forming region and the first P-type MIS forming region exposed. Thereafter, portions formed in the first N-type MIS forming region and the first P-type MIS forming region of the third gate insulating film forming film are removed by wet etching using a hydrofluoric acid-based solution, where the resist Re3 is used as a mask.

Thus, third gate insulating film forming films 403C and 403D made of a silicon oxide film having a film thickness of 7 nm are formed on the third active regions 400c and 400d.

Figure 11C:
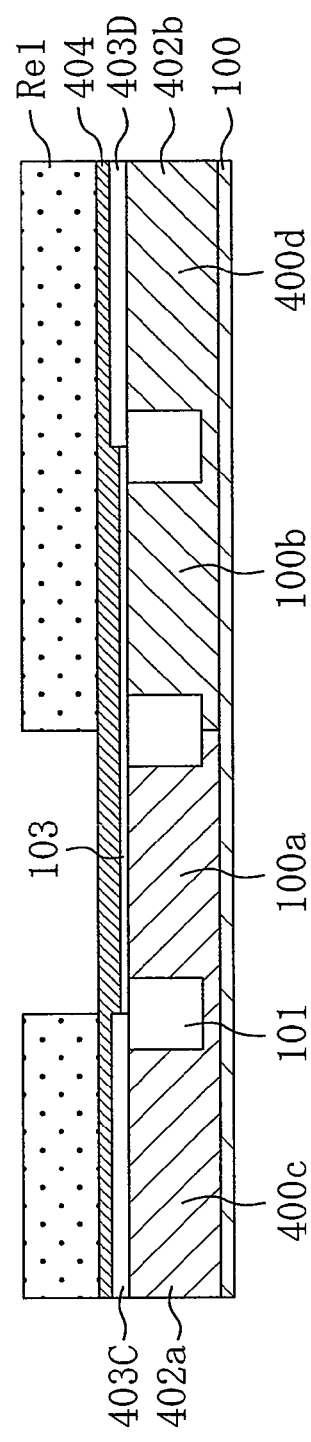

Next, as shown in FIG. 11C, after the resist Re3 is removed, a surface of the semiconductor substrate 100 is cleaned by known RCA. Thereafter, a second gate insulating film forming film 103 made of, for example, a silicon oxide film having a film thickness of 2 nm is formed on the first and second active regions 100a and 100b by, for example, ISSG.

Thereafter, a first electrode forming film 404 made of, for example, a polysilicon film having a film thickness of 20 nm is deposited on the second gate insulating film forming film 103 and the third gate insulating film forming films 403C and 403D by, for example, CVD, and thereafter, a resist Re1 is formed on the semiconductor substrate 100 by photolithography, covering the second n-type MIS forming region, the first P-type MIS forming region, and the second p-type MIS forming region while leaving the first N-type MIS forming region exposed (note that the step for the first N-type MIS forming region and the first P-type MIS forming region of FIG. 11C corresponds to the above-described step of FIG. 3B).

Next, as shown in FIG. 12A, portions formed in the first N-type MIS forming region of the first electrode forming film 404 and the second gate insulating film forming film 103 are successively removed by dry etching using the resist Re1 as a mask.

Thus, as shown in FIG. 12A, in an internal circuit region, a first electrode forming film 404B made of a polysilicon film having a film thickness of 20 nm is formed via the second gate insulating film forming film 103B made of the silicon oxide film having a film thickness of 2 nm on the second active region 100b. In addition, in a peripheral circuit region, first electrode forming films 404C and 404D made of a polysilicon film having a film thickness of 20 nm are formed via the third gate insulating film forming films 403C and 403D made of the silicon oxide film having a film thickness of 7 nm on the third active regions 400c and 400d.

Thereafter, after the resist Re1 is removed, a surface of the semiconductor substrate 100 is cleaned by known RCA. Thereafter, a first insulating film 405 made of, for example, a high-k film having a film thickness of 2 nm is formed on an entire surface of the semiconductor substrate 100 by, for example, MOCVD.

In this case, as shown in FIG. 12A, the first insulating film 405 has first gate insulating film forming films 405CC, 405AA, 405BB, and 405DD formed on the third, first, second, and third active regions 400c, 100a, 100b, and 400d, respectively, and a sidewall insulating film forming film 405XYZ formed on the isolation region 101 between the first active region 100a and the second active region 100b.

Thereafter, a resist Re2 is formed on the semiconductor substrate 100 by photolithography, covering the first N-type MIS forming region while leaving the second n-type MIS forming region, the first P-type MIS forming region, and the second p-type MIS forming region exposed (note that the step in the first N-type MIS forming region and the first P-type MIS forming region of FIG. 12A corresponds to the above-described steps of FIGS. 3C and 4A).

Next, as shown in FIG. 12B, a portion of the first insulating film 405 which is exposed through the opening of the resist Re2 is removed by dry etching or wet etching using the resist Re2 as a mask, and thereafter, the resist Re2 is removed.

Thus, as shown in FIG. 12B, the first gate insulating film forming films 405CC, 405BB, and 405DD on the first electrode forming films 404C, 404B, and 404D are removed, leaving a first gate insulating film forming film 405A on the first active region 100a. In addition, a portion (see 105Z in FIG. 7 described above) formed on the first electrode forming film 404B of the sidewall insulating film forming film 405XYZ is removed, leaving a sidewall insulating film forming film 405XY extending form an upper surface of the isolation region 101 in the first N-type MIS forming region across a side surface of the first electrode forming film 404B (note that the step in the first N-type MIS forming region and the first P-type MIS forming region of FIG. 12B corresponds to the above-described step of FIG. 4B).

Next, as shown in FIG. 12C, a second electrode forming film made of, for example, a polysilicon film having a film thickness of 120 nm is deposited on an entire surface of the semiconductor substrate 100 by, for example, CVD, and thereafter, a surface of the second electrode forming film is subjected to planarization by CMP. Thereby, a second electrode forming film 406A made of a polysilicon film having a film thickness of 100 nm is formed on the first N-type MIS forming region of the semiconductor substrate 100, while a second electrode forming film 406B made of a polysilicon film having a film thickness of 80 nm is formed on the first P-type MIS forming region of the semiconductor substrate 100. In addition, second electrode forming films 406C and 406D made of a polysilicon film having a film thickness of 80 nm are formed on the second n-type MIS forming region and the second p-type MIS forming region of the semiconductor substrate 100, respectively.

Thus, as shown in FIG. 12C, in the internal circuit region, the second electrode forming film 406A made of the polysilicon film having a film thickness of 100 nm is formed via the first gate insulating film forming film 405A made of the high-k film having a film thickness of 2 nm on the first active region 100a. On the other hand, the first electrode forming film 404B made of the polysilicon film having a film thickness of 20 nm and the second electrode forming film 406B made of the polysilicon film having a film thickness of 80 nm are formed via the second gate insulating film forming film 103B made of the silicon oxide film having a film thickness of 2 nm on the second active region 100b (note that the step in the first N-type MIS forming region and the first P-type MIS forming region of FIG. 12C corresponds to the above-described step of FIG. 4C).

In addition, in the peripheral circuit region, the first electrode forming films 404C and 404D made of the polysilicon film having a film thickness of 20 nm and the second electrode forming films 406C and 406D made of the polysilicon film having a film thickness of 80 nm are successively formed via the third gate insulating film forming films 403C and 403D made of the silicon oxide film having a film thickness of 7 nm on the third active regions 400c and 400d, respectively.

Next, by lithography and ion implantation, an n-type impurity, such as P (phosphor) or the like, is implanted into the second electrode forming film 406C and the first electrode forming film 404C in the second n-type MIS forming region and the second electrode forming film 406A in the first N-type MIS forming region, and a p-type impurity, such as B (boron) or the like, is implanted into the second electrode forming film 406B and the first electrode forming film 404B in the first P-type MIS forming region, and the second electrode forming film 406D and the first electrode forming film 404D in the second p-type MIS forming region.

Next, by photolithography and dry etching, the second electrode forming film 406A and the first gate insulating film forming film 405A on the first active region 100a are subjected to patterning, thereby successively forming a first gate insulating film (see 105a in FIG. 5A described above) made of the film first gate insulating film forming film 405A and a first gate electrode (see 108a in FIG. 5A described above) made of the second electrode forming film 406A on the on the first active region 100a. On the other hand, the second electrode forming film 406B, the first electrode forming film 404B, and the second gate insulating film forming film 103B on the second active region 100b are subjected to patterning, thereby successively forming a second gate insulating film (see 103b in FIG. 5A: described above) made of the second gate insulating film forming film 103B and a second gate electrode (see 108b in FIG. 5A: described above) made of the first electrode forming film 404B and the second electrode forming film 406B on the second active region 100b.

In addition, the second electrode forming films 406C and 406D, the first electrode forming films 404C and 404D, and the third gate insulating film forming films 403C and 403D on the third active regions 400c and 400d are subjected to patterning, thereby successively forming a third gate insulating film made of the third gate insulating film forming films 403C and 403D and a third gate electrode made of the first electrode forming films 404C and 404D and the second electrode forming films 406C and 406D on the third active regions 400c and 400d. Here, the third gate insulating film has a larger film thickness than that of the second gate insulating film, and is made of the same insulating material as that of the second gate insulating film.

In this case, the sidewall insulating film forming film 405XY is also subjected to patterning, thereby forming a sidewall insulating film (see 105xy in FIG. 2B: described above) made of the sidewall insulating film forming film 405XY on the isolation region 101. Specifically, the sidewall insulating film is formed, extending from an upper surface of the isolation region 101 in the first N-type MIS forming region across a side surface of the first electrode, and is made of the same insulating material as that of the first gate insulating film. The first gate electrode (made of the second electrode forming film 406A) and the second electrode (made of the second electrode forming film 406B) are integrally formed. Thus, as in the first embodiment, upper regions of the first gate electrode and the second gate electrode are electrically connected to each other on the isolation region 101, while lower regions thereof are separated from each other with the sidewall insulating film being interposed therebetween.

Next, steps similar to those of FIGS. 5A to 5C and 6A and 6B are successively performed (see the first embodiment).

Thus, the semiconductor device of this embodiment can be manufactured.

According to this embodiment, an effect similar to that of the first embodiment can be obtained. Specifically, in the step of FIG. 12A, only the first gate insulating film forming films 405CC, 405BB, and 405DD on the first electrode forming films 404C, 404B, and 404D can be selectively removed. Also, in the FIG. 11C, the second gate insulating film forming film 103B can be prevented from being damaged by the removal of the resist Re1.

Specifically, according to this embodiment, even in a semiconductor device comprising I/O (Input/Output) transistors (i.e., an N-type MIS transistor nTr and a P-type MIS transistor pTr formed in a peripheral circuit region (specifically, a second n-type MIS forming region and a second p-type MIS forming region)), first and second gate insulating films made of insulating materials differing between the N-type MIS transistor NTr and the P-type MIS transistor PTr can be formed in an internal circuit region with high accuracy, thereby making it possible to provide N- and P-type MIS transistors having desired device characteristics.

Here, a higher voltage is applied to the MIS transistors nTr and pTr formed in the peripheral circuit region than to the MIS transistors NTr and PTr formed in the internal circuit region (specifically, the first N-type MIS forming region and the first P-type MIS forming region), and therefore, the third gate insulating film (made of the third gate insulating film forming films 403C and 403D) has a relatively large film thickness (specifically, the third gate insulating film has a larger film thickness than that of the second gate insulating film (made of the second gate insulating film forming film 103B)). Therefore, the third gate insulating film forming films 403C and 403D are less likely to be damaged by the removal of the resist Re3 (see FIG. 11B).

Note that, in this embodiment, a specific example has been described in which the first embodiment is employed (specifically, the steps in the first N-type MIS forming region and the first P-type MIS forming region of FIGS. 11B, 11C, and 12A to 12C correspond to the steps of the first embodiment of FIGS. 3A to 3C and 4A to 4C). The present invention is not limited to this. For example, the second embodiment or the third embodiment may be employed. When the second embodiment is employed, an effect similar to that of the second embodiment can be obtained. On the other hand, when the third embodiment is employed, an effect similar to that of the third embodiment can be obtained.

Fifth Embodiment

Hereinafter, a method for manufacturing a semiconductor device according to a fifth embodiment of the present invention will be described with reference to FIGS. 13A to 13C. FIGS. 13A to 13C are cross-sectional views showing major steps of the manufacturing method in the order in which the device is manufactured, as the device is viewed in a gate width direction. Note that, in these figures, a second n-type MIS forming region n and a first N-type MIS forming region N are shown on the left side, while a first P-type MIS forming region P and a second p-type MIS forming region p are shown on the right side. Here, in FIGS. 13A to 13C, the same parts as those of the semiconductor device of the fourth embodiment above are indicated by the same reference symbols and will not be described.

Here, a difference between the fourth embodiment and the fifth embodiment is as follows.

In the fourth embodiment, in the step of FIG. 11B, wet etching is performed using. as a mask, the resist Re3 through which the first P-type MIS forming region and the first N-type MIS forming region are exposed, thereby causing the third gate insulating film forming films 403C and 403D to remain on the third active regions 400c and 400d. In this embodiment, in the step of FIG. 13B, wet etching is performed using, as a mask, a resist Re4 through which only the first P-type MIS forming region, thereby causing a third gate insulating film forming film 503A to remain on the first active region 100a as well as causing the third gate insulating film forming films 403C and 403D to remain on the third active regions 400c and 400d.

Firstly, as shown in FIG. 13A, a step similar to the step of FIG. 11A is performed.

Next, as shown in FIG. 13B, after a surface of the semiconductor substrate 100 is cleaned by a treatment with diluted hydrofluoric acid, a third gate insulating film forming film made of, for example, a silicon oxide film having a film thickness of 7 nm is formed on the third, first, second, and third active regions 400c, 100a, 100b, and 400d by, for example, ISSG. Thereafter, by photolithography, a resist Re4 is formed on the semiconductor substrate 100, covering the second n-type MIS forming region, the first N-type MIS forming region, and the second p-type MIS forming region while leaving the first P-type MIS forming region exposed. Thereafter, a portion formed on the first P-type MIS forming region of the third gate insulating film forming film is removed by wet etching using a hydrofluoric acid-based solution, where the resist Re4 is used as a mask.

Thus, third gate insulating film forming films 403C and 403D made of the silicon oxide film having a film thickness of 7 nm are formed on the third active regions 400c and 400d, and in addition, a third gate insulating film forming film 503A made of the silicon oxide film having a film thickness of 7 nm is formed on the first active region 100a.

Next, as shown in FIG. 13C, after the resist Re4 is removed, a surface of the semiconductor substrate 100 is cleaned by known RCA, and thereafter, a second gate insulating film forming film 503B made of, for example, a silicon oxide film having a film thickness of 2 nm is formed on the second active region 100b by, for example, ISSG.

Thereafter, a first electrode forming film 404 made of a polysilicon film having a film thickness of 20 nm is deposited on the second gate insulating film forming film 503B and the third gate insulating film forming films 403C, 503A, and 403D by, for example, CVD, and thereafter, a resist Re1 is formed on the semiconductor substrate 100 by photolithography, covering the second n-type MIS forming region, the first P-type MIS forming region, and the second p-type MIS forming region while leaving the first N-type MIS forming region exposed.

Next, portions formed in the first N-type MIS forming region of the first electrode forming film 404 and the third gate insulating film forming films 403C, 503A, and 403D are successively removed by dry etching using the resist Re1 as a mask.

Thus, in an internal circuit region, a first electrode forming film made of the polysilicon film having a film thickness of 20 nm is formed via the second gate insulating film forming film 503B made of the silicon oxide film having a film thickness of 2 nm the second active region 100b. In addition, in a peripheral circuit region, a first electrode forming film made of the polysilicon film having a film thickness of 20 nm is formed via the third gate insulating film forming films 403C and 403D made of the silicon oxide film having a film thickness of 7 nm on the third active regions 400c and 400d.

Thereafter, after the resist Re1 is removed, a surface of the semiconductor substrate 100 is cleaned by known RCA. Thereafter, a first insulating film made of, for example, a high-k film having a film thickness of 2 nm (see 405 in FIG. 12A) is formed on an entire surface of the semiconductor substrate 100 by, for example, MOCVD.

Thereafter, a resist (see Re2 in FIG. 12A) is formed on the semiconductor substrate 100 by photolithography, covering the first N-type MIS forming region while leaving exposed the second n-type MIS forming region, the first P-type MIS forming region, and the second p-type MIS forming region.

Next, the above-described steps of FIGS. 12B and 12C are successively performed (see the fourth embodiment).

Next, steps similar to those of FIGS. 5A to 5C and 6A and 6B are successively performed (see the first embodiment).

Thus, the semiconductor device of this embodiment can be manufactured.

According to this embodiment, an effect similar to the fourth embodiment can be obtained. Specifically, even in the semiconductor device comprising the I/O transistors nTr and pTr, the first and second gate insulating films made of insulating materials differing between the N-type MIS transistor NTr and the P-type MIS transistor PTr can be formed in the internal circuit region with high accuracy, thereby making it possible to provide N- and P-type MIS transistors having desired device characteristics.

In addition, according to this embodiment, in the step of FIG. 13B, a portion formed in the first P-type MIS forming region of the third gate insulating film forming film is removed in a state in which the resist Re4 covering the first N-type MIS forming region as well as the second n-type MIS forming region and the second p-type MIS forming region is formed on the semiconductor substrate 100. Therefore, as compared to the fourth embodiment, the number of times which the first N-type MIS forming region in the semiconductor substrate 100 is exposed to etching can be reduced. Therefore, in the first N-type MIS forming region, etching damage on the semiconductor substrate 100 can be reduced and etching depth in the isolation region 101 can be suppressed.

Specifically, according to the fourth embodiment, in the step of FIG. 11B, portions formed in the first N-type MIS forming region as well as the first P-type MIS forming region of the third gate insulating film forming film are removed in a state in which the resist Re3 covering the second n-type MIS forming region and the second p-type MIS forming region are formed on the semiconductor substrate 100. Therefore, although the first N-type MIS forming region in the semiconductor substrate 100 is exposed to etching in the step of FIG. 11B in the fourth embodiment, the first N-type MIS forming region in the semiconductor substrate 100 is not exposed to etching in the step of FIG. 13B in this embodiment.

Sixth Embodiment

Hereinafter, a method for manufacturing a semiconductor device according to a sixth embodiment of the present invention will be described with reference to FIGS. 14A to 14C, 15A to 15C, 16A to 16C, and 17A to 17C. FIGS. 14A to 14C, 15A to 15C, 16A to 16C, and 17A to 17C are cross-sectional views showing major steps of the manufacturing method in the order in which the device is manufactured, as the device is viewed in a gate width direction. Note that, in these figures, an N-type MIS forming region N is shown on the left side and a P-type MIS forming region P is shown on the right side. Here, in FIGS. 14A to 14C, 15A to 15C, 16A to 16C, and 17A to 17C, the same parts as those of the semiconductor device of the first embodiment above are indicated by the same reference symbols and will not be described.

Here, a difference between the first embodiment and this embodiment is as follows.

In the first embodiment, the second electrode 106a made of a second silicon film (specifically, a polysilicon film) is used as the first gate electrode 108a, and the first electrode 104b made of a first silicon film (specifically, a polysilicon film) and the second electrode 106b made of a second silicon film (specifically, a polysilicon film) formed on the first electrode 104b, are used as the second gate electrode 108b. In this embodiment, a first silicide film (made of, specifically, a NiSi film) is used as a first gate electrode 617a, and a second silicide film (made of, specifically, a Ni$_2$Si film) is used as a second gate electrode 617b.

Firstly, the steps of FIGS. 3A to 3C and 4A to 4C are successively performed.

Next, a protective film made of, for example, a silicon oxide film is formed on the second silicon film (see 106A and 106B in FIG. 4C) by, for example, CVD.

Figure 14A:
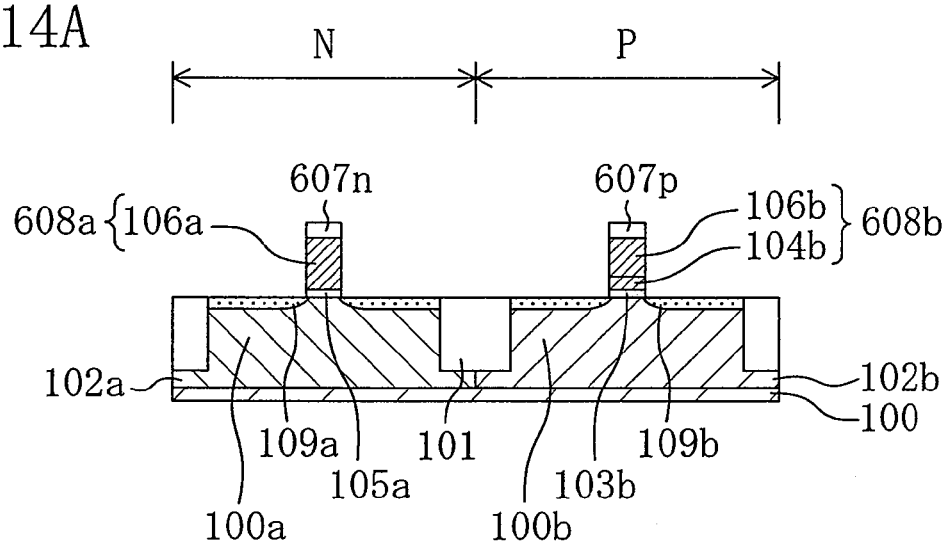
FIGS. 14A to 14C are cross-sectional views showing major steps of a method for manufacturing a semiconductor device according to a sixth embodiment of the present invention in the order in which the device is manufactured, as the device is viewed in a gate length direction.

Next, as shown in FIG. 14A, the protective film, the second silicon film (see 106A in FIG. 4C), and the first gate insulating film forming film (see 105A in FIG. 4C) on the first active region 100a are subjected to patterning by photolithography and dry etching, thereby successively forming a first gate insulating film 105a made of the first gate insulating film forming film, a first silicon gate electrode 608a made of the second silicon film 106a, and a first protective film 607n on the first active region 100a. On the other hand, the protective film, the second silicon film (see 106B in FIG. 4C) and the first silicon film (see 104B in FIG. 4C), and the second gate insulating film forming film (see 103B in FIG. 4C) on the second active region 100b are subjected to patterning, thereby successively forming the second gate insulating film 103b made of the second gate insulating film forming film, a second silicon gate electrode 608b in which the first silicon film 104b and the second silicon film 106b are successively laminated, and a second protective film 607p on the second active region 100b.

In this case, the sidewall insulating film forming film (see 105XY in FIG. 4C) is also subjected to patterning, thereby forming a sidewall insulating film (see 105xy in FIG. 18 described below) made of the sidewall insulating film forming film on the isolation region 101, though it is not shown, since FIG. 14A shows a cross-section as viewed in the gate length direction.

Thereafter, an n-type impurity is implanted into the first active region 100a by ion implantation using the first silicon gate electrode 608a as a mask, thereby forming a first extension region 109a outside the first silicon gate electrode 608a in the first active region 100a in a self-aligned manner. On the other hand, a p-type impurity is implanted into the second active region 100b using the second silicon gate electrode 608b as a mask, thereby forming a second extension region 109b outside the second silicon gate electrode 608b in the second active region 100b in a self-aligned manner (note that the step of FIG. 14A corresponds to the above-described step of FIG. 5A).

Figure 14B:
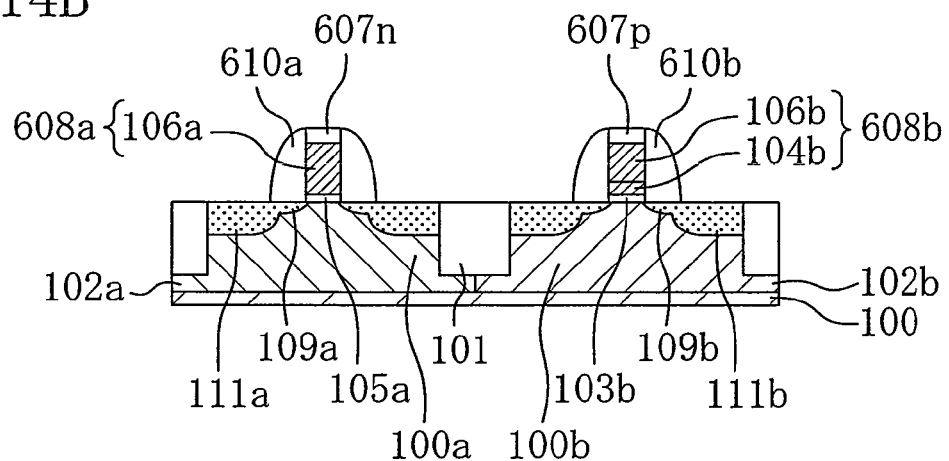

Next, as shown in FIG. 14B, a silicon nitride film having a film thickness of 50 nm is deposited on an entire surface of the semiconductor substrate 100 by, for example, CVD, covering the first and second silicon gate electrodes 608a and 608b, and thereafter, the silicon nitride film is subjected to anisotropic etching, thereby forming first and second sidewalls 610a and 610b made of a silicon nitride film on side surfaces of the first and second silicon gate electrodes 608a and 608b on upper surfaces of which the first and second protective films 607n and 607p are formed.

Thereafter, by ion implantation, an n-type impurity is implanted into the first active region using the first silicon gate electrode 608a and the first sidewall 610a as a mask, and a p-type impurity is implanted into the second active region using the second silicon gate electrode 608b and the second sidewall 610b as a mask. Thereafter, by a thermal treatment, a first source/drain region 111a having a junction portion deeper than that of the first extension region 109a is formed outside the first sidewall 610a in the first active region in a self-aligned manner, and a second source/drain region 111b having a junction portion deeper than that of the second extension region 109b is formed outside the second sidewall 610b in the second active region in a self-aligned manner (note that the step of FIG. 14B corresponds to the above-described step of FIG. 5B).

Figure 14C:
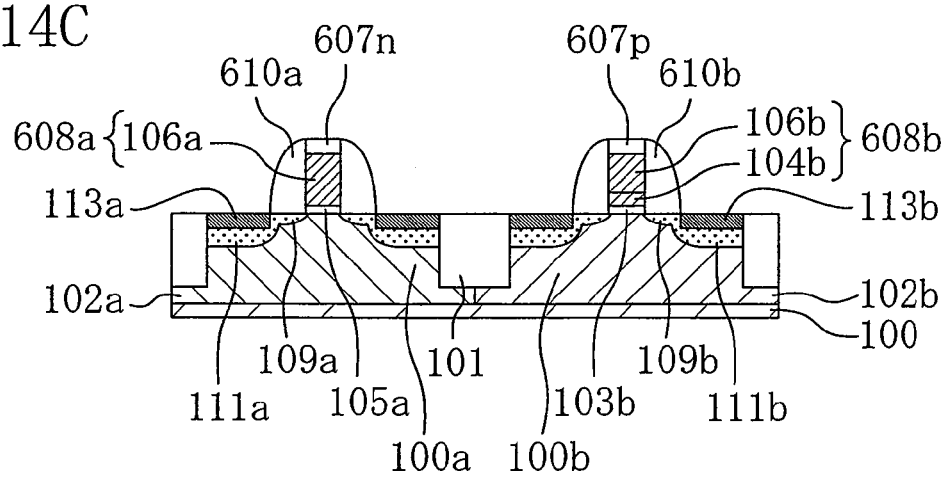

Next, as shown in FIG. 14C, after a natural oxide film (not shown) formed on the first and second source/drain regions 111a and 111b is removed, a first metal film (not shown) made of, for example, nickel having a film thickness of 10 nm is deposited on an entire surface of the semiconductor substrate 100, covering the first and second silicon gate electrodes 608a and 608b and the first and second sidewalls 610a and 610b by, for example, sputtering.

Thereafter, Si in the first and second source/drain regions 111a and 111b and Ni in the first metal film are caused to react with each other, for example, in a nitrogen atmosphere and at a temperature of 320° C. by the first RTA treatment, thereby forming third and fourth silicide layers 113a and 113b made of a nickel silicide film in upper portions of the first and second source/drain regions 111a and 111b.

Thereafter, the semiconductor substrate 100 is immersed in an etchant which is a mixture of sulfuric acid and hydrogen peroxide solution, thereby removing an unreacted first metal film remaining on the isolation region 101, the first and second sidewalls 610a and 610b, the first and second protective films 607n and 607p, and the like. Thereafter, the silicide composition ratios of the third and fourth silicide layers 113a and 113b are stabilized by the second RTA treatment at a temperature (e.g., 550° C.) higher than that of the first RTA treatment (note that the step of FIG. 14C corresponds to the above-described step of FIG. 5C).

Figure 15A:
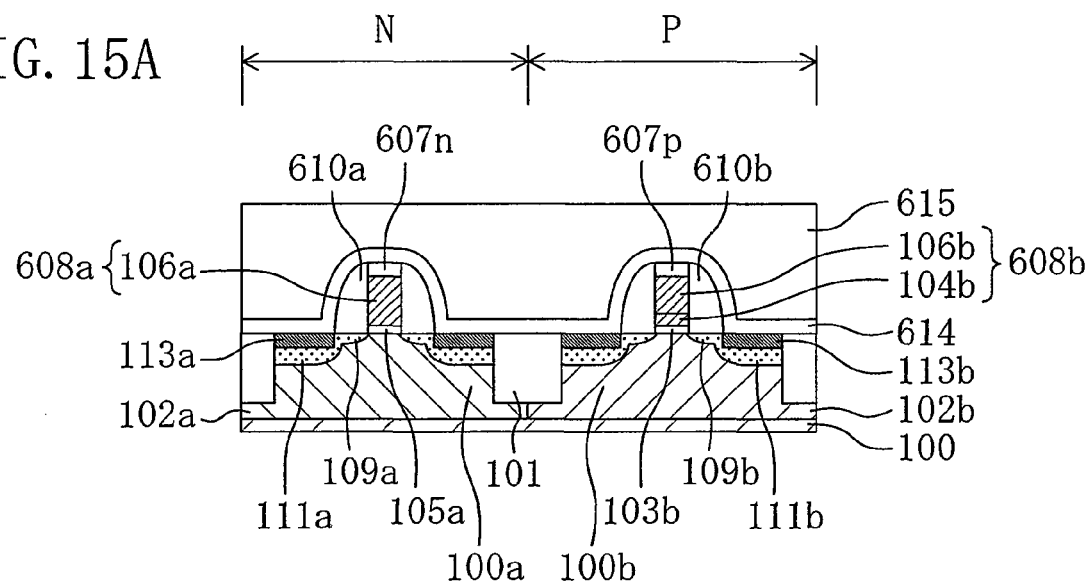
FIGS. 15A to 15C are cross-sectional views showing major steps of the semiconductor device manufacturing method of the sixth embodiment of the present invention in the order in which the device is manufactured, as the device is viewed in a gate length direction.

Next, as shown in FIG. 15A, an underlying insulating film 614 made of, for example, a silicon nitride film is formed on an entire surface of the semiconductor substrate 100, covering the first and second silicon gate electrodes 608a and 608b and the first and second sidewalls 610a and 610b. Thereafter, a first interlayer insulating film 615 made of, for example, a silicon oxide film is formed on the underlying insulating film 614, and thereafter, a surface of the first interlayer insulating film 615 is subjected to planarization by CMP (note that the step of FIG. 15A corresponds to the above-described step of FIG. 6A).

Figure 15B:
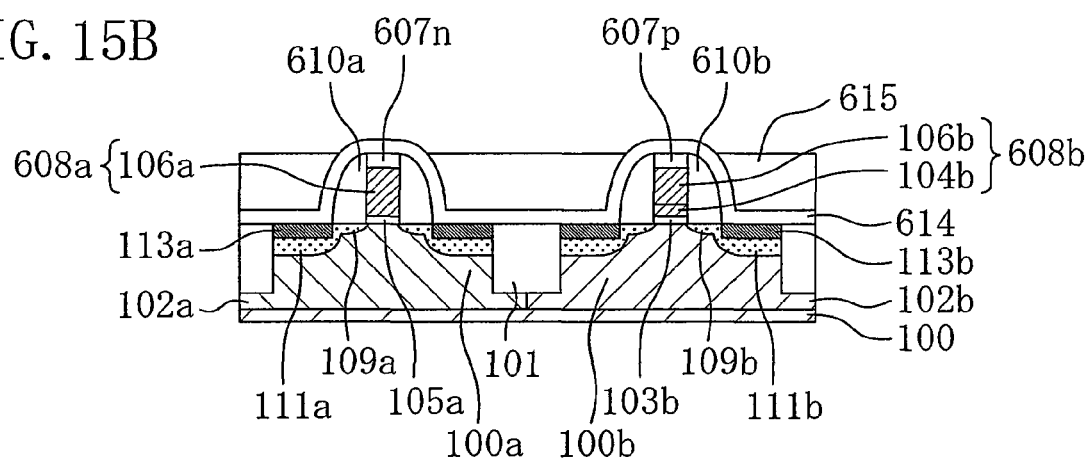

Next, as shown in FIG. 15B, portions formed on the first and second protective films 607n and 607p of the first interlayer insulating film 615 are removed by dry etching or wet etching which has a large etching selection ratio with respect to a silicon nitride film (the underlying insulating film 614), thereby exposing an upper surface of the underlying insulating film 614.

Figure 15C:
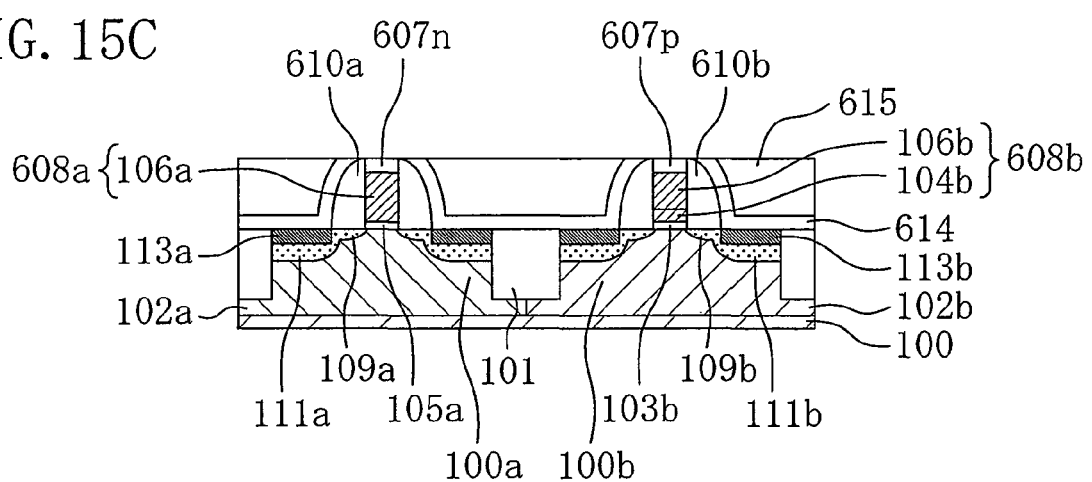

Next, as shown in FIG. 15C, portions formed on the first and second protective films 607n and 607p of the underlying insulating film 614 are removed by dry etching or wet etching which has a large etching selection ratio with respect to a silicon oxide film (the first and second protective films 607n and 607p and the first interlayer insulating film 615).

Figure 16A:
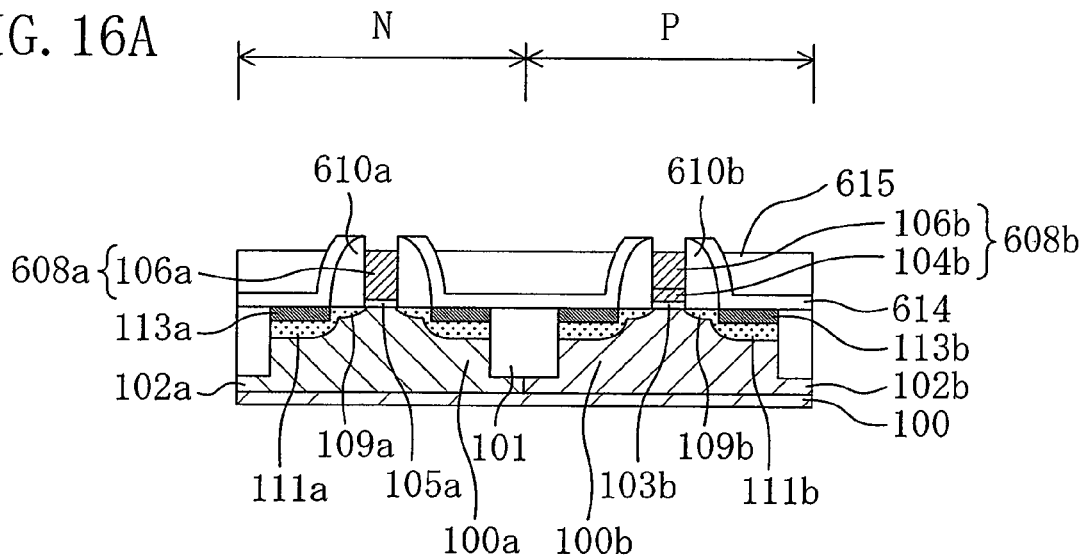
FIGS. 16A to 16C are cross-sectional views showing major steps of the semiconductor device manufacturing method of the sixth embodiment of the present invention in the order in which the device is manufactured, as the device is viewed in a gate length direction.

Next, as shown in FIG. 16A, the first and second protective films 607n and 607p, and portions formed on the first and second silicon gate electrodes 608a and 608b of the first interlayer insulating film 615 are removed by dry etching or wet etching which has a large etching selection ratio with respect to a polysilicon film (the first and second silicon gate electrodes 608a and 608b) and a silicon nitride film (the underlying insulating film 614), thereby exposing upper surfaces of the first and second silicon gate electrodes 608a and 608b.

Figure 16B:
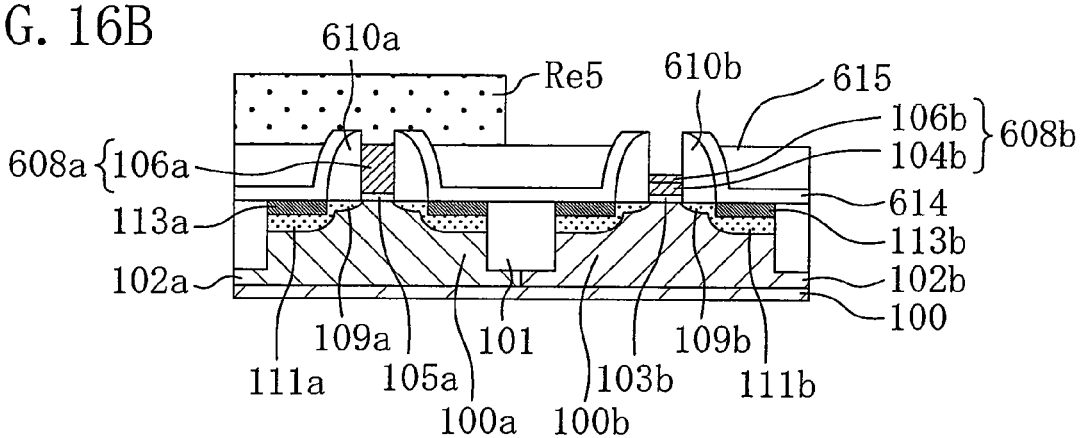

Next, as shown in FIG. 16B, a resist Re5 is formed on the semiconductor substrate 100 by photolithography, covering the N-type MIS forming region while leaving the P-type MIS forming region exposed. Thereafter, using the resist Re5 as a mask, an upper portion of the second silicon gate electrode 608b is removed to a film thickness of, for example, 20 nm by etching which has selectivity to a silicon oxide film (the first interlayer insulating film 615) and a silicon nitride film (the underlying insulating film 614).

Figure 16C:
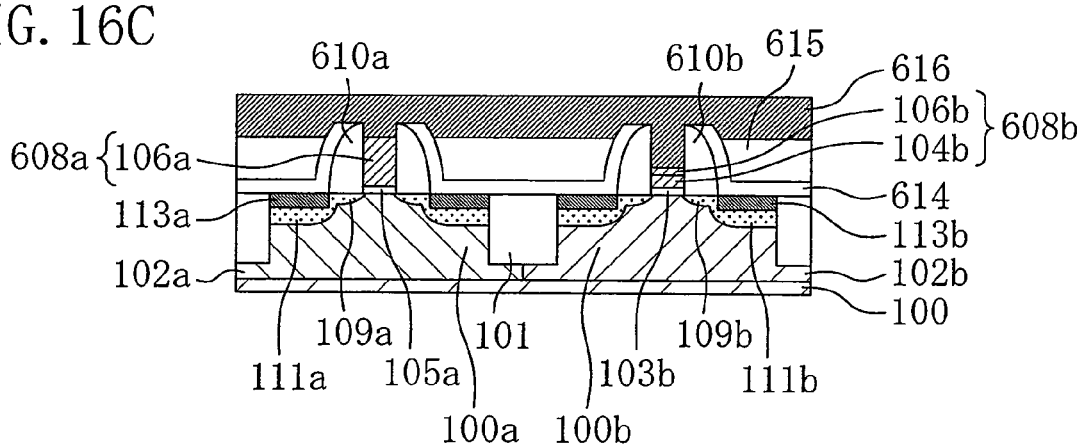

Next, as shown in FIG. 16C, after the resist Re5 is removed, a second metal film 616 made of, for example, nickel having a film thickness of 70 nm is deposited on an entire surface of the semiconductor substrate 100 by sputtering.

Figure 17A:
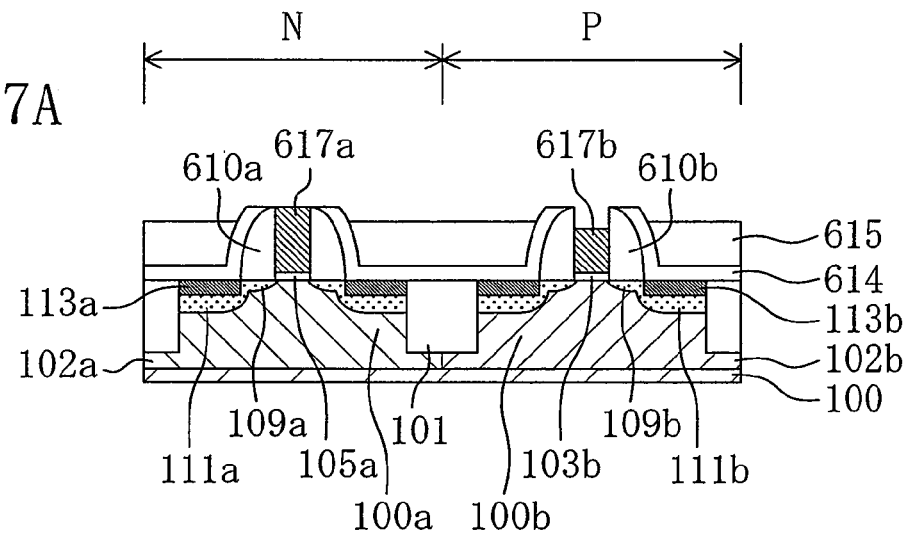
FIGS. 17A to 17C are cross-sectional views showing major steps of the semiconductor device manufacturing method of the sixth embodiment of the present invention in the order in which the device is manufactured, as the device is viewed in a gate length direction.

Next, as shown in FIG. 17A, Si in the first and second silicon gate electrodes 608a and 608b and Ni in the second metal film 616 are caused to react with each other by a third RTA treatment in a nitrogen atmosphere at 380° C., thereby forming, for example, a first gate electrode 617a made of NiSi and a second gate electrode 617b made of $Ni_2Si$.

Thereafter, an unreacted second metal film 616 remaining on the first interlayer insulating film 615, the first and second sidewalls 610a and 610b, the underlying insulating film 614, and the like is removed by immersing the semiconductor substrate 100 in an etchant which is a mixture of sulfuric acid and hydrogen peroxide solution. Thereafter, the silicide composition ratios of the first and second gate electrodes 617a and 617b are stabilized by a fourth RTA treatment at a temperature (e.g., 550° C.) higher than that of the third RTA treatment.

Thus, the first gate electrode 617a made of, for example, NiSi is formed via the first gate insulating film 105a made of, for example, a high-k film having a thickness of 2 nm on the first active region, while the second gate electrode 617b made of, for example, $Ni_2Si$ is formed via the second gate insulating film 103b made of, for example, a silicon oxide film having a film thickness of 2 nm on the second active region.

Figure 17B:
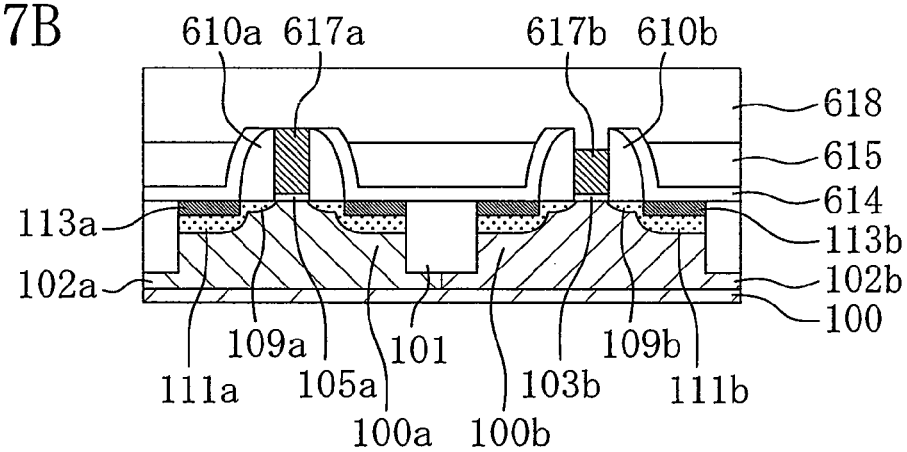

Next, as shown in FIG. 17B, a second interlayer insulating film 618 is formed on the first interlayer insulating film 615 by, for example, CVD, and thereafter, a surface of the second interlayer insulating film 618 is subjected to planarization by CMP.

Figure 17C:
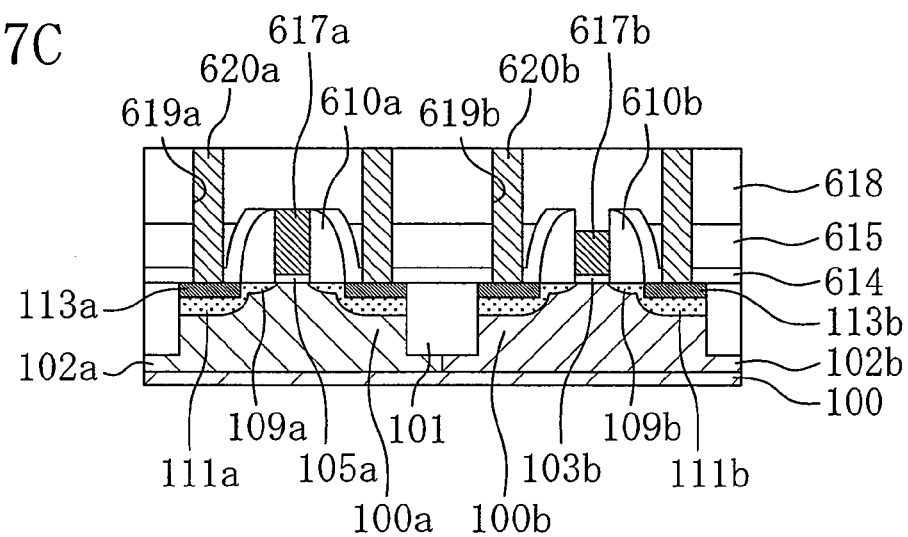

Next, as shown in FIG. 17C, after a resist (not shown) is formed on the second interlayer insulating film 618, holes through which an upper surface of the underlying insulating film 614 is exposed are formed in the first interlayer insulating film 615 and the second interlayer insulating film 618 by first dry etching using the resist as a mask. Thereafter, portions exposed in the holes of the underlying insulating film 614 are removed by second dry etching. Thereby, first and second contact holes 619a and 619b which reach upper surfaces of the third and fourth silicide layers 113a and 113b, respectively, are formed in the underlying insulating film 614, the first interlayer insulating film 615, and the second interlayer insulating film 618. Thus, by the two-step etching, it is possible to reduce the amount of overetching with respect to the third and fourth silicide layers 113a and 113b.

Thereafter, a barrier metal film including a titanium film and a titanium nitride film which are successively laminated is formed in a bottom portion and a sidewall portion of each of the first and second contact holes 619a and 619b by sputtering or CVD. Thereafter, a tungsten film is deposited on the second interlayer insulating film 618 by CVD, filling the first and second contact holes 619a and 619b. Thereafter, portions of the tungsten film which are formed outside the first and second contact holes 619a and 619b are removed by CMP. Thus, first and second contact plugs 620a and 620b in which the tungsten film is buried are formed via the barrier metal film in the first and second contact holes 619a and 619b, respectively. Thereafter, metal wiring (not shown) which is electrically connected to the first and second contact plugs 620a and 620b is formed on the second interlayer insulating film 618 (note that the step of FIG. 17C corresponds to the above-described step of FIG. 6B).

Thus, the semiconductor device of this embodiment can be manufactured.

Figure 18:
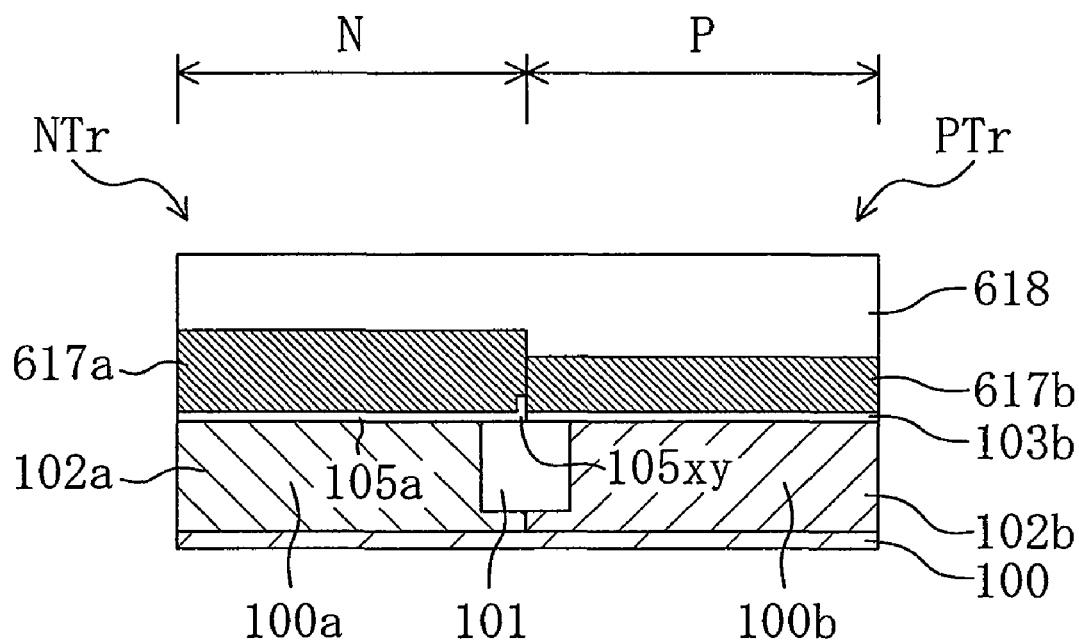
FIG. 18 is a cross-sectional view showing a structure of the semiconductor device of the sixth embodiment of the present invention as viewed in a gate width direction.

Hereinafter, a structure of the semiconductor device of the sixth embodiment of the present invention will be described with reference to FIG. 18. FIG. 18 is a cross-sectional view showing the structure of the semiconductor device of the sixth embodiment of the present invention as viewed in a gate width direction. Note that, in the figure, the N-type MIS forming region N and the P-type MIS forming region P are illustrated as being arranged side by side for the sake of simplicity. Here, in FIG. 18, the same parts as those of the semiconductor device of the first embodiment above are indicated by the same reference symbols and will not be described.

As shown in FIG. 18, the first gate electrode 617a made of, for example, NiSi is formed via the first gate insulating film 105a on the first active region 100a. On the other hand, the second gate electrode 617b made of, for example, $Ni_2Si$ is formed via the second gate insulating film 103b on the second active region 100b. The second interlayer insulating film 618 is formed on the semiconductor substrate 100.

As shown in FIG. 18, a sidewall insulating film 105xy having an L-shaped cross-section and made of the same insulating material as that of the first gate insulating film 105a is formed, extending from an upper surface of the isolation region 101 in the N-type MIS forming region across a side surface of the second gate electrode 617b. Thus, upper regions of the first gate electrode 617a and the second gate electrode 617b are electrically connected to each other on the isolation region 101, and the lower regions thereof are separated from each other with the sidewall insulating film 105xy being interposed therebetween.

According to this embodiment, an effect similar to that of the first embodiment can be obtained. Specifically, in this embodiment, even in the semiconductor device having the fully-silicided gate electrode, the first and second gate insulating films 105a and 103b made of insulating materials differing between the N-type MIS transistor NTr and the P-type MIS transistor PTr can be formed with high accuracy, thereby making it possible to provide N- and P-type MIS transistors having desired device characteristics.

Note that a specific example has been described in this embodiment, in which the first embodiment is employed (specifically, the steps of the first embodiment of FIGS. 3A to 3C and 4A to 4C are successively performed before the steps of the fourth embodiment of FIGS. 14A to 14C, 15A to 15C, 16A to 16C, and 17A to 17C are successively performed). The present invention is not limited to this. For example, the second embodiment or the third embodiment may be employed. When the second embodiment is employed, an effect similar to that of the second embodiment can be obtained. On the other hand, when the third embodiment is employed, an effect similar to that of the third embodiment can be obtained.

Note that a specific example has been described in this embodiment, in which:

1) the first gate insulating film 105a made of a high-k film; and 2) the second gate insulating film 103b made of a silicon oxide film are used. The present invention is not limited to this. Alternatively, a first gate insulating film forming film made of, for example, $Hf_{0.7}SiON$ may be used instead of the first gate insulating film forming films 105AA and 105BB made of a high-k film (see FIG. 4A), while a second gate insulating film forming film made of, for example, $Hf_{0.5}SiON$ may be used instead of the second gate insulating film forming film 103 made of a silicon oxide film (see FIG. 3B), thereby providing:

1) a first gate insulating film made of a first high-k film (e.g., $Hf_{0.7}SiON$); and 2) a second gate insulating film made of a second high-k film (e.g., $Hf_{0.5}SiON$).

Alternatively, for example, a first gate insulating film forming film made of HfAlSiON and a second gate insulating film forming film made of HfSiON may be used to provide:

1) a first gate insulating film made of a first high-k film (e.g., HfAlSiON); and 2) a second gate insulating film made of a second high-k film (e.g., HfSiON).

Thus, even when the first high-k film and the second high-k film are insulating materials having different compositions or composition ratios, an effect similar to this embodiment can be obtained.

Seventh Embodiment

Hereinafter, a method for manufacturing a semiconductor device according to a seventh embodiment of the present invention will be described with reference to FIGS. 19A to 19D and 20A to 20C. FIGS. 19A to 19D and 20A to 20C are cross-sectional views showing major steps of the manufacturing method of the semiconductor device of the seventh embodiment of the present invention in the order in which the device is manufactured. Note that FIGS. 19A to 19D are cross-sectional views showing the major steps as the device is viewed in a gate width direction, where an N-type MIS forming region N is shown on the left side and a P-type MIS forming region P is shown on the right side. On the other hand, FIGS. 20A to 20C are cross-sectional views showing the major steps as the device is viewed in a gate length direction, where the N-type MIS forming region N on the left side and the P-type MIS forming region P on the right side are illustrated as being arranged side by side for the sake of simplicity. Here, in 19A to 19D and 20A to 20C, the same parts as those of the semiconductor device of the second embodiment above are indicated by the same reference symbols and will not be described.

Here, a difference between this embodiment and the second embodiment is as follows.

In the second embodiment, as the first electrode and the second electrode included in the second gate electrode and the third electrode and the fourth electrode included in the first gate electrode, the followings are used:

1) a first silicon film (made of a first electrode forming film) as the first electrode;

2) a second silicon film (made of a third electrode forming film) as the second electrode;

3) a third silicon film (made of a second electrode forming film) as the third electrode; and 4) a second silicon film (made of the third electrode forming film) as the fourth electrode. In contrast to this, in this embodiment, the followings are used:

1) a first metal film (made of a first electrode forming film) as the first electrode;

2) a silicon film (made of a third electrode forming film) as the second electrode;

3) a second metal film (made of a second electrode forming film) as the third electrode; and 4) a silicon film (made of the third electrode forming film) as the fourth electrode.

Firstly, the above-described steps of FIGS. 3A and 3B are successively performed using a first electrode forming film made of, for example, a TiN film having a film thickness of 10 nm instead of the first electrode forming film 103 made of a polysilicon film having a film thickness of 40 nm of the second embodiment.

Figure 19A:
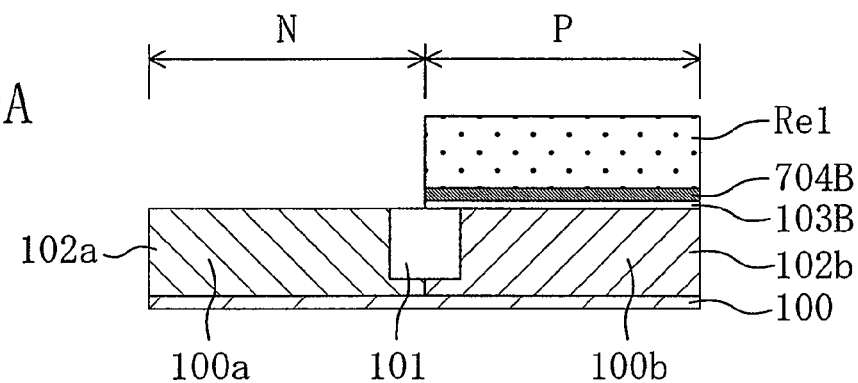
FIGS. 19A to 19D are cross-sectional views showing major steps of a method for manufacturing a semiconductor device according to a seventh embodiment of the present invention in the order in which the device is manufactured, as the device is viewed in a gate width direction.
Figure 20A:
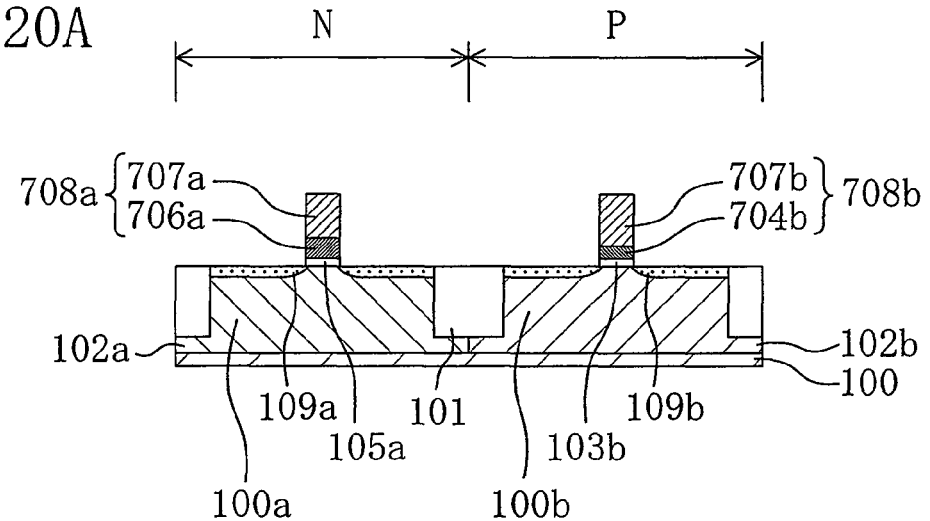
FIGS. 20A to 20C are cross-sectional views showing major steps of the semiconductor device manufacturing method of the seventh embodiment of the present invention in the order in which the device is manufactured, as the device is viewed in a gate length direction.
Figure 20B:
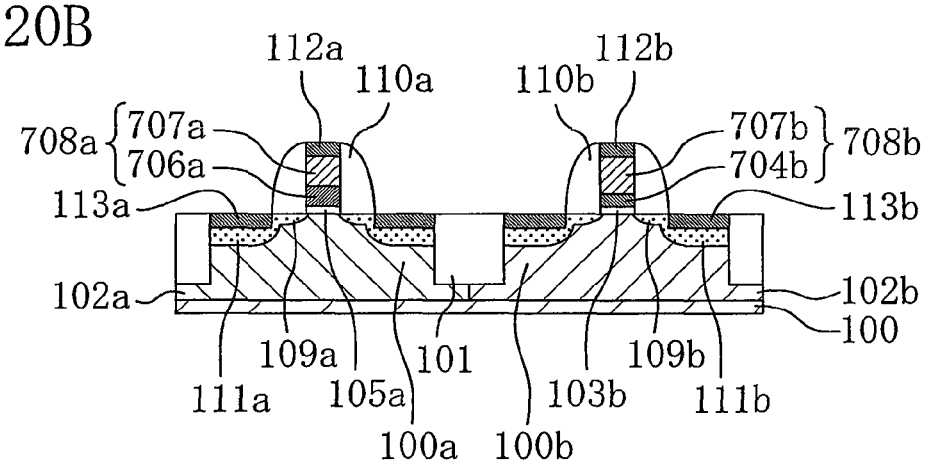
Figure 20C:
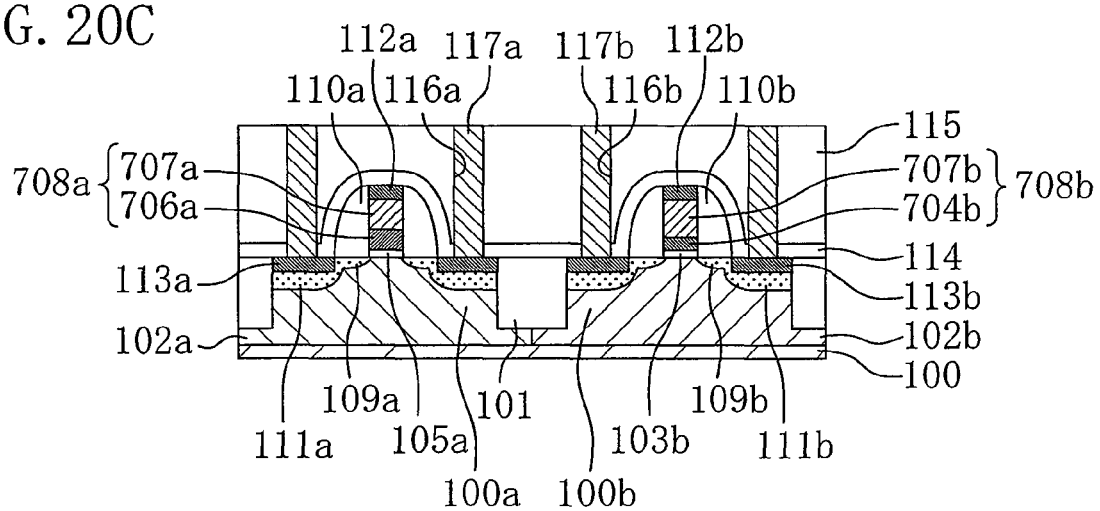

Next, as shown in FIG. 19A, portions formed in the N-type MIS forming region of the first electrode forming film and the second gate insulating film forming film are successively removed by dry etching or wet etching using a resist Re1 as a mask (note that the step of FIG. 19A corresponds to the above-described step of FIG. 8A).

Thus, as shown in FIG. 19A, a first electrode forming film 704B made of TiN having a film thickness of 10 nm is formed via the second gate insulating film forming film 103B made of a silicon oxide film having a film thickness of 2 nm on the second active region 100b.

Figure 19B:
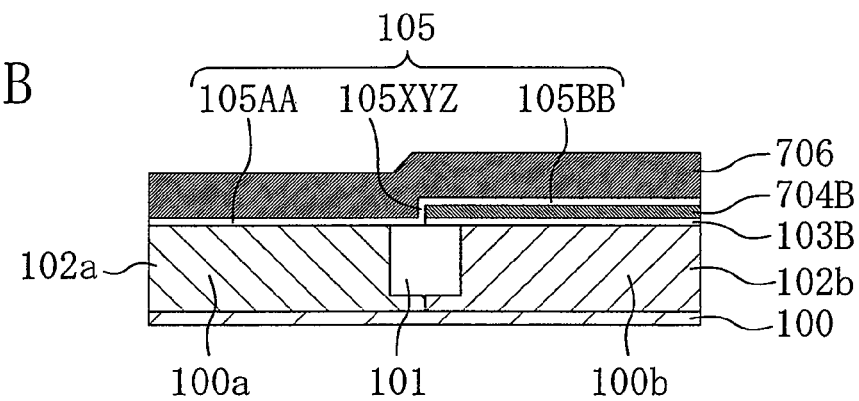

Next, as shown in FIG. 19B, after the resist Re1 is removed, a surface of the semiconductor substrate 100 is cleaned by a treatment with diluted hydrofluoric acid. Thereafter, a first insulating film 105 made of, for example, a high-k film having a film thickness of 2 nm is formed on an entire surface of the semiconductor substrate 100 by, for example, MOCVD. In this case, as shown in FIG. 19B, the first insulating film 105 has first gate insulating film forming films 105AA and 105BB formed on the first and second active regions 100a and 100b and a sidewall insulating film forming film 105XYZ formed on the isolation region 101.

Thereafter, a second electrode forming film 706 made of, for example, TaSiN film having a film thickness of 30 nm is deposited on the first insulating film 105 by, for example, PVD (specifically, a step similar to that of FIG. 8B is performed using the second electrode forming film 706 made of, for example, a TaSiN film having a film thickness of 30 nm instead of the second electrode forming film 206 made of a polysilicon film having a film thickness of 100 nm of the second embodiment).

Figure 19C:
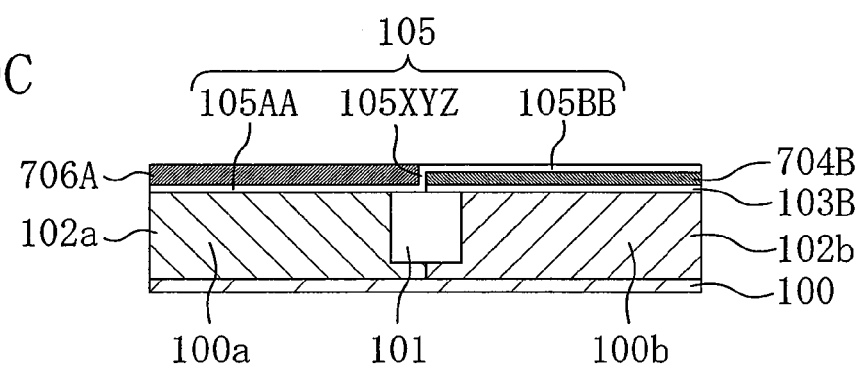

Next, as shown in FIG. 19C, by a step similar to that of FIG. 8C, the second electrode forming film 706 on the first electrode forming film 704B (specifically, the first gate insulating film forming film 105BB) is removed, leaving a second electrode forming film 706A made of the TaSiN film having a film thickness of 10 nm on the first active region 100*a*.

Figure 19D:
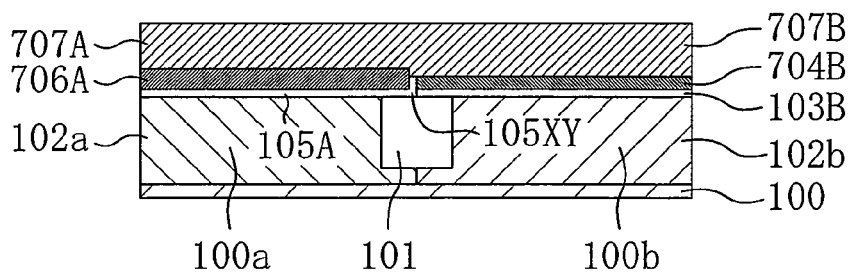

Next, as shown in FIG. 19D, by a step similar to that of FIG. 8D, the first gate insulating film forming film 105BB on the first electrode forming film 704B is removed, leaving a first gate insulating film forming film 105A on the first active region 100*a*, while a portion (see 105Z in FIG. 7 described above) formed on the first electrode forming film 704B of the sidewall insulating film forming film 105XYZ is removed, leaving a sidewall insulating film forming film 105XY on the isolation region 101.

Thereafter, a third electrode forming film made of, for example, a P (phosphor)-doped polysilicon film having a film thickness of 100 nm is deposited on an entire surface of the semiconductor substrate 100 by, for example, CVD. Thereby, a third electrode forming film 707A made of the P-doped polysilicon film having a film thickness of 100 nm is formed on the N-type MIS forming region in the semiconductor substrate 100, while a third electrode forming film 707B made of the P-doped polysilicon film having a film thickness of 100 nm is formed on the P-type MIS forming region in the semiconductor substrate 100 (specifically, a step similar to that of FIG. 8D is performed using the third electrode forming films 707A and 707B made of the P-doped polysilicon film having a film thickness of 100 nm instead of the third electrode forming films 207A and 207B made of a polysilicon film having a film thickness of 60 nm in the second embodiment).

Thus, as shown in FIG. 19D, the second electrode forming film 706A made of the TaSiN film having a film thickness of 10 nm and the third electrode forming film 707A made of the P-doped polysilicon film having a film thickness of 100 nm are formed via the first gate insulating film forming film 105A made of the high-k film having a film thickness of 2 nm are successively formed on the first active region 100*a*. On the other hand, the first electrode forming film 704B made of the TiN film having a film thickness of 10 nm and the third electrode forming film 707B made of the P-doped polysilicon film having a film thickness of 100 nm are successively formed via the second gate insulating film forming film 103B made of the silicon oxide film of a film thickness of 2 nm on the second active region 100*b*.

Next, as shown in FIG. 20A, the third electrode forming film 707A, the second electrode forming film 706A, and the first gate insulating film forming film 105A on the first active region 100*a* are subjected to patterning by photolithography and dry etching, thereby successively forming a first gate insulating film 105*a* made of the first gate insulating film forming film 105A, a third electrode 706*a* made of the second electrode forming film 706A, and a fourth electrode 707*a* made of the third electrode forming film 707A on the first active region 100*a*. On the other hand, the third electrode forming film 707B, the first electrode forming film 704B, and the second gate insulating film forming film 103B on the second active region 100*b* are subjected to patterning, thereby successively forming a second gate insulating film 103*b* made of the second gate insulating film forming film 103B, a first electrode 704*b* made of the first electrode forming film 704B, and a second electrode 707*b* made of the third electrode forming film 707B on the second active region 100*b*.

In this case, the sidewall insulating film forming film 105XY is also subjected to patterning, thereby forming a sidewall insulating film (see 105*xy* in FIG. 21 described below) made of the sidewall insulating film forming film 105XY on the isolation region 101.

Thus, a first gate electrode 708*a* in which the third electrode 706*a* and the fourth electrode 707*a* are successively laminated is formed via the first gate insulating film 105*a* on the first active region 100*a*, while a second gate electrode 708*b* in which the first electrode 704*b* and the second electrode 707*b* are successively laminated is formed via the second gate insulating film 103*b* on the second active region 100*b*.

Thereafter, by a step similar to that of FIG. 5A, a first extension region 109*a* is formed outside the first gate electrode 708*a* in the first active region 100*a*, while a second extension region 109*b* is formed outside the second gate electrode 708*b* in the second active region 100*b*.

Next, as shown in FIG. 20B, by a step similar to that of FIG. 5B, first and second sidewalls 110*a* and 110*b* made of, for example, a silicon nitride film are formed on side surfaces of the first and second gate electrodes 708*a* and 708*b*, respectively. Thereafter, a first source/drain region 111*a* is formed outside the first sidewall 110*a* of the first active region 100*a*, and a second source/drain region 111*b* is formed outside the second sidewall 110*b* of the second active region 100*b*.

Thereafter, by a step similar to that of FIG. 5C, a first silicide layer 112*a* is formed in an upper portion of the first gate electrode 708*a*, while a second silicide layer 112*b* is formed in an upper portion of the second gate electrode 708*b*. On the other hand, a third silicide layer 113*a* is formed in an upper portion of the first source/drain region 111*a*, while a fourth silicide layer 113*b* is formed in an upper portion of the second source/drain region 111*b*.

Next, as shown in FIG. 20C, by a step similar to that of FIG. 6A, an underlying insulating film 114 made of, for example, a silicon nitride film is formed on an entire surface of the semiconductor substrate 100, covering the first and second gate electrodes 708*a* and 708*b* and the first and second sidewalls 110*a* and 110*b*, and thereafter, an interlayer insulating film 115 made of, for example, a silicon oxide film is formed on the underlying insulating film 114.

Thereafter, by a step similar to that of FIG. 6B, first and second contact plugs 117*a* and 117*b* in which a tungsten film is buried are formed via a barrier metal film in which a titanium film and a titanium nitride film are successively laminated, within the first and second contact holes 116*a* and 116*b* in the underlying insulating films 114 and the interlayer insulating film 115, respectively. Thereafter, metal wiring (not shown) which is electrically connected to the first and second contact plugs 117*a* and 117*b* are formed on the interlayer insulating film 115.

Thus, the semiconductor device of this embodiment can be manufactured.

Figure 21:
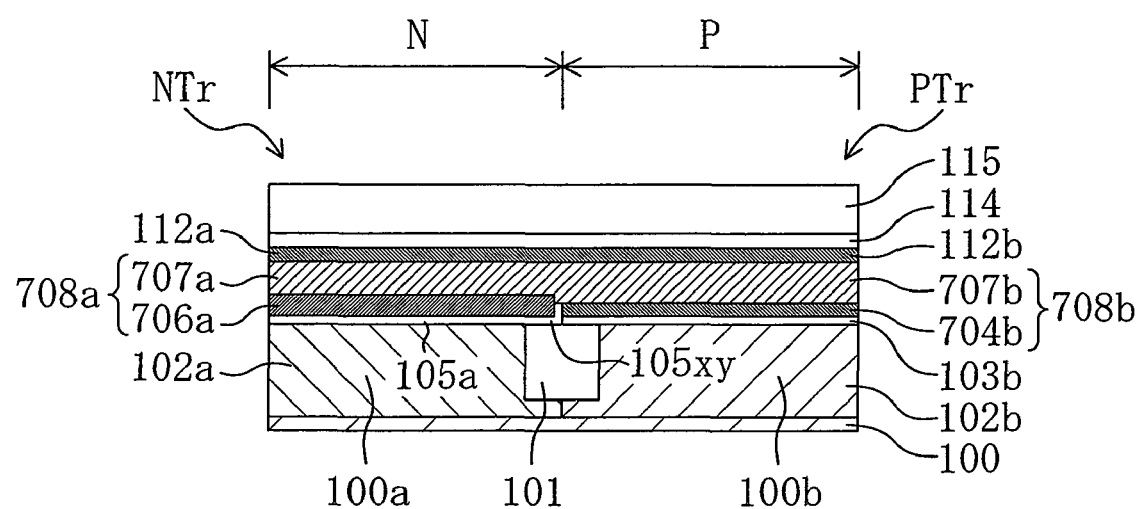
FIG. 21 is a cross-sectional view showing a structure of the semiconductor device of the seventh embodiment of the present invention as viewed in a gate width direction.

Hereinafter, a structure of the semiconductor device of the seventh embodiment of the present invention will be described with reference to FIG. 21. FIG. 21 is a cross-sectional view showing the structure of the semiconductor device of the seventh embodiment of the present invention as viewed in a gate width direction. Note that, in the figure, an N-type MIS forming region N is shown on the left side and a P-type MIS forming region P is shown on the right side. In FIG. 21, the same parts as those of the semiconductor device of the first embodiment above are indicated by the same reference symbols and will not be described.

As shown in FIG. 21, the sidewall insulating film 105*xy* having an L-shaped cross-section and made of the same insulating material as the first gate insulating film 105*a*, is provided, extending from an upper surface of the isolation region 101 in the N-type MIS forming region across a space between the third electrode 706*a* and the first electrode 704*b*. The second electrode 707*b* and the fourth electrode 707*a* are integrally formed. Thus, upper regions of the first gate electrode 708*a* and the second gate electrode 708*b* are electrically connected to each other, while lower regions thereof are separated from each other with the sidewall insulating film 105xy is being interposed therebetween, on the isolation region 101. Note that it has been described in this embodiment that the first electrode forming film (first metal film) 704B which will become the first electrode 704b is a TiN film and the second electrode forming film (second metal film) 706 which will become the third electrode 706a is a TaSiN film. The present invention is not limited to this. The first electrode forming film (first metal film) and the second electrode forming film (second metal film) may be made of metal materials having different compositions or composition ratios. Examples of a metal material for the first electrode forming film or the second electrode forming film include any metal of aluminum (Al), titanium (Ti), tungsten (W), tantalum (Ta), and molybdenum (Mo), and nitrides, carbon nitrides or silicon nitrides of alloys of these metals.

According to this embodiment, an effect similar to that of the second embodiment can be obtained. Specifically, in this embodiment, even in a semiconductor device having a metal gate electrode, the first and second gate insulating films 105a and 103b made of insulating materials differing between the N-type MIS transistor NTr and the P-type MIS transistor PTr can be formed with high accuracy, so that the N- and P-type MIS transistors NTr and PTr can have desired device characteristics.

Note that, in this embodiment, a specific example in which the second embodiment is employed (specifically, the steps of FIGS. 19A to 19D in this embodiment correspond to the steps of FIGS. 8A to 8D) has been described in detail. The present invention is not limited to this. For example, the first embodiment or the third embodiment may be employed.

Thus, 1) the first gate electrode and 2) the second gate electrode are arranged as follows.

In this embodiment:
1) the first gate electrode includes a third electrode made of a second metal film and a fourth electrode made of a silicon film; and
2) the second gate electrode includes a first electrode made of a first metal film and a second electrode made of a silicon film.

When the first embodiment is employed:
1) the first gate electrode is made of a silicon film; and
2) the second gate electrode includes a first electrode made of a metal film and a second electrode made of a silicon film.

On the other hand, when the third embodiment is employed:
1) the first gate electrode is made of a second metal film; and
2) the second gate electrode is made of a first metal film.

In this embodiment, a specific example has been described which employs:
1) the first gate insulating film 105a made of a high-k film; and
2) the second gate insulating film 103b made of a silicon oxide film.

The present invention is not limited to this. The first gate insulating film forming films 105AA and 105BB made of a high-k film (see FIG. 4A) may be, as in the sixth embodiment:
1) a first gate insulating film made of a first high-k film (e.g., $Hf_{0.7}SiON$); and
2) a second gate insulating film made of a second high-k film (e.g., $Hf_{0.5}SiON$) instead of the second gate insulating film forming film 103 made of a silicon oxide film (see FIG. 3B).

Alternatively, the followings may be used:
1) a first gate insulating film made of a first high-k film (e.g., HfAlSiON); and
2) a second gate insulating film made of a second high-k film (e.g., HfSiON).

Specifically, even when the first high-k film and the second high-k film are made of insulating materials having different compositions or composition ratios, an effect similar to that of this embodiment can be obtained.

In this embodiment, the third electrode forming films 707A and 707B are a P (phosphor)-doped polysilicon film. Alternatively, an undoped polysilicon film may be formed, and thereafter, an impurity may be implanted thereinto by ion implantation.

—Sidewall Insulating Film—

Figure 22A:
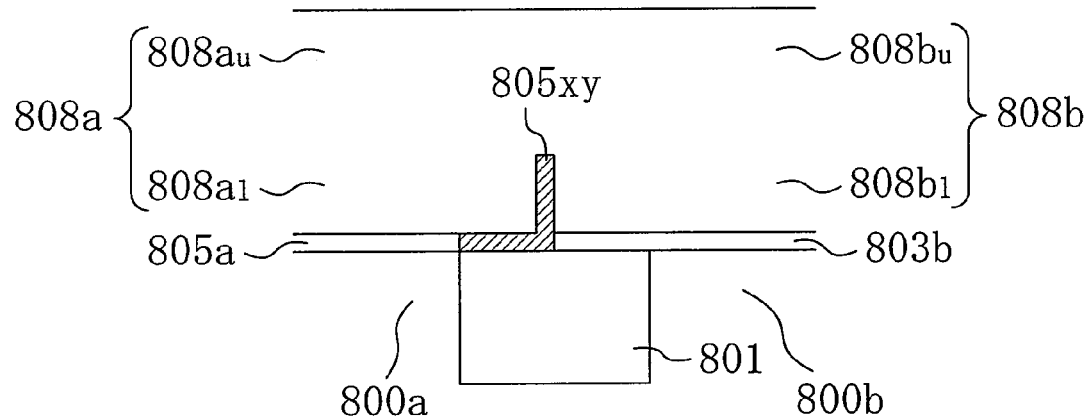
FIGS. 22A to 22C are cross-sectional views showing a sidewall insulating film forming region as viewed in a gate width direction.

Note that it has been described in the first to seventh embodiments that a sidewall insulating film is interposed between a lower region of the first gate electrode and a lower region of the second gate electrode. Specifically, as shown in FIG. 22A, a sidewall insulating film 805xy which is formed integrally with a first gate insulating film 805a is provided, extending from an upper surface of an isolation region 801 across a space between a lower region 808$a_l$ of a first gate electrode 808a and a lower region 808$b_l$ of a second gate electrode 808b. The present invention is not limited to this.

Figure 22B:
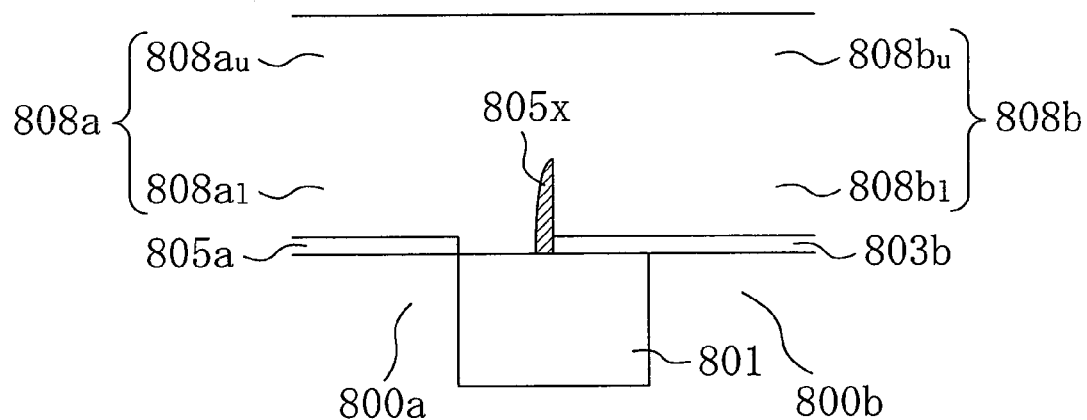

For example, as shown in FIG. 22B, a sidewall insulating film 805x which is formed and separated from the first gate insulating film 805a may be provided between the lower region 808$a_l$ of the first gate electrode 808a and the lower region 808$b_l$ of the second gate electrode 808b. Alternatively, for example, as shown in FIG. 22C, a sidewall insulating film 805xyz which is formed integrally with the first gate insulating film 805a may be provided, extending from the upper surface of the isolation region 801 across the space between the lower region 808$a_l$ of the first gate electrode 808a and the lower region 808$b_l$ of the second gate electrode 808b and further across the lower region 808$b_l$ and an upper region 808$b_u$ of the second gate electrode 808b.

Figure 22C:
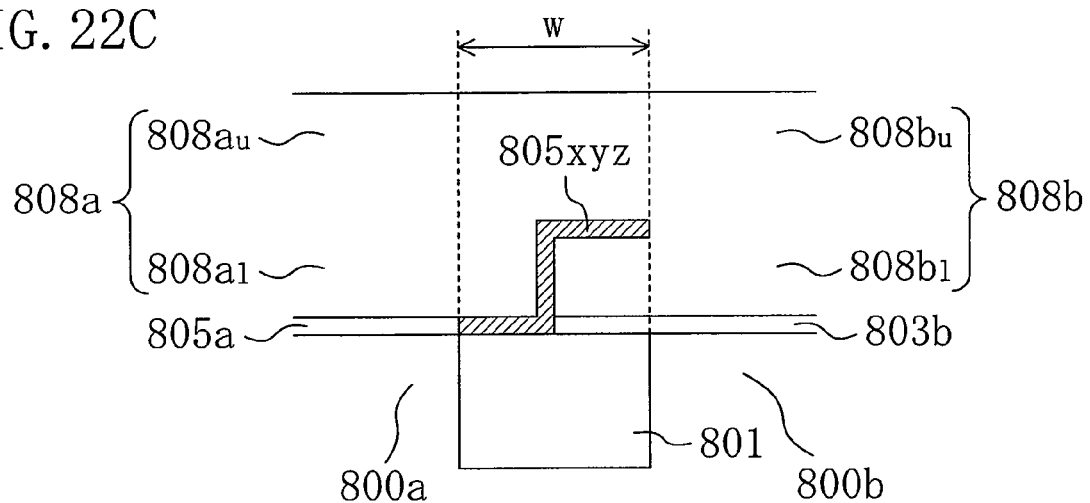

Thus, the sidewall insulating films 805xy, 805x, and 805xyz may be formed within a region having a width of the isolation region 801 (see a width w of FIG. 22C).

Note that, as described above, the present invention can provide gate insulating films made of insulating materials differing between an N-type MIS transistor and a P-type MIS transistor with high accuracy, and therefore, is useful for a semiconductor device comprising an N-type MIS transistor and a P-type MIS transistor and a manufacturing method thereof.

What is claimed is:

1. A semiconductor device comprising:
   a first MIS transistor; and
   a second MIS transistor,
   wherein
   the first MIS transistor includes:
   a first active region surrounded by an isolation region in a semiconductor substrate;
   a first gate insulating film formed on the first active region; and
   a first gate electrode including a first metal film formed on the first gate insulating film, and a first silicon film formed directly on the first metal film,
   the second MIS transistor includes:
   a second active region surrounded by the isolation region in the semiconductor substrate;
   a second gate insulating film formed on the second active region and made of an insulating material different from that of the first gate insulating film; and a second gate electrode including a second metal film formed on the second gate insulating film, and a second silicon film formed directly on the second metal film, the isolation region has an isolation part located between the first active region and the second active region adjacent to each other along a gate width direction, the first gate electrode and the second gate electrode extend on the isolation part, the first gate electrode and the second gate electrode have opposing surfaces facing each other on the isolation part, a part of the opposing surface located in the first silicon film and a part of the opposing surface located in the second silicon film are connected to each other so that the first silicon film and the second silicon film are integrally formed with each other, and a part of the opposing surface located in the first metal film and a part of the opposing surface located in the second metal film are separated from each other with a sidewall insulating film interposed therebetween, the sidewall insulating film being integrally formed with the first gate insulating film, and being formed on the isolation part.

2. The semiconductor device of claim 1, further comprising:
a first silicide layer formed on the first gate electrode; and
a second silicide layer formed on the second gate electrode.

3. The semiconductor device of claim 1, further comprising:
a first sidewall formed on a side surface of the first gate electrode;
a first source/drain region formed outside the first sidewall in the first active region;
a second sidewall formed on a side surface of the second gate electrode; and
a second source/drain region formed outside the second sidewall in the second active region.

4. The semiconductor device of claim 3, further comprising:
a third silicide layer formed on the first source/drain region; and
a fourth silicide layer formed on the second source/drain region.

5. The semiconductor device of claim 1, wherein
the first MIS transistor is an N-type MIS transistor, and
the second MIS transistor is a P-type MIS transistor.

6. The semiconductor device of claim 1, wherein
the sidewall insulating film is provided on a side surface of an edge portion of the second metal film in the second gate electrode in the gate width direction, the edge portion being located on the isolation part.

7. The semiconductor device of claim 1, wherein
the sidewall insulating film is provided so as to be in contact with respective side surfaces of the first metal film and the second metal film.

8. The semiconductor device of claim 1, wherein the sidewall insulating film has the same thickness as a thickness of the first gate insulating film.

9. The semiconductor device of claim 1, wherein an upper surface of a part of the first metal film located above the first active region is higher than an upper surface of a part of the second metal film located above the second active region.

10. The semiconductor device of claim 1, wherein an upper surface of a part of the first metal film located above the first active region is higher than an upper edge of the sidewall insulating film.

11. The semiconductor device of claim 1, wherein a height of an upper surface of a part of the second metal film located above the second active region is substantially the same as that of the upper edge of the sidewall insulating film.

12. The semiconductor device of claim 1, wherein a thickness of a part of the first silicon film located above the first active region is thinner than a thickness of a part of the second silicon film located above the second active region.

13. The semiconductor device of claim 1, wherein
the first metal film is made of a TaSiN film, and
the second metal film is made of a TiN film.

14. The semiconductor device of claim 1, wherein the first silicon film and the second silicon film are made of a P-doped polysilicon film.

15. The semiconductor device of claim 1, wherein the first metal film and the second metal film are made of metal materials having different compositions or composition ratios.

16. The semiconductor device of claim 1, wherein a metal material for the first metal film or the second metal film include any metal of aluminum (Al), titanium (Ti), tungsten (W), tantalum (Ta), and molybdenum (Mo), and nitrides, carbon nitrides or silicon nitrides of alloys of these metals.

17. The semiconductor device of claim 1, wherein
the first gate insulating film is made of $Hf_{0.7}SiON$, and
the second gate insulating film is made of $Hf_{0.5}SiON$.

18. The semiconductor device of claim 1, wherein
the first gate insulating film is made of HfAlSiON, and
the second gate insulating film is made of HfSiON.

* * * * *